(12) United States Patent
Emerson et al.

(10) Patent No.: US 10,320,177 B2
(45) Date of Patent: Jun. 11, 2019

(54) POWER DISTRIBUTION SYSTEM AND METHOD, AND CIRCUIT BREAKER FOR USE THEREIN

(71) Applicant: EMNEVE PTY LIMITED, Cromer (AU)

(72) Inventors: Scott Damien Emerson, Newport (AU); Gordon James Newlan, Carlingford (AU); Marc Phillip Veenendaal, Caringbah (AU)

(73) Assignee: EMNEVE PTY LIMITED (AU)

( * ) Notice: Subject to any disclaimer, the term of this patent is extended or adjusted under 35 U.S.C. 154(b) by 98 days.

(21) Appl. No.: 14/651,993

(22) PCT Filed: Jun. 13, 2013

(86) PCT No.: PCT/AU2013/001467
§ 371 (c)(1),
(2) Date: Jun. 12, 2015

(87) PCT Pub. No.: WO2014/089637
PCT Pub. Date: Jun. 19, 2014

(65) Prior Publication Data
US 2015/0326001 A1  Nov. 12, 2015

(30) Foreign Application Priority Data

Dec. 13, 2012 (AU) .................. 2012905447

(51) Int. Cl.
*H02H 3/00* (2006.01)
*G01R 15/20* (2006.01)
*H02H 3/08* (2006.01)
*H02H 1/00* (2006.01)
*H02J 13/00* (2006.01)

(52) U.S. Cl.
CPC ............. *H02H 3/08* (2013.01); *G01R 15/202* (2013.01); *H02H 1/0007* (2013.01); *H02H 1/0092* (2013.01); *H02H 3/006* (2013.01); *H02J 13/0006* (2013.01)

(58) Field of Classification Search
CPC .............................. H02H 3/08; G01R 15/202
See application file for complete search history.

(56) References Cited

U.S. PATENT DOCUMENTS 5,506,789 A    4/1996  Russell et al.
6,043,641 A *  3/2000  Singer .................. G01R 15/181
                                                        324/115

(Continued)

*Primary Examiner* — Ronald W Leja
*Assistant Examiner* — Christopher J Clark
(74) *Attorney, Agent, or Firm* — McHale & Slavin, P.A.

(57) ABSTRACT

A programmable circuit breaker, including an input unit, a sensor, and, a trip mechanism. The input unit permits user input and/or adjustment of predetermined load parameters. The sensor senses actual values of a load. A microcontroller receives and processes the values, and operates/trips the circuit breaker when the sensed values exceed predetermined load parameters. The sensor preferably includes a Hall-Effect sensor. The circuit breaker is preferably able to be programmed, monitored and/or tripped remotely. It preferably includes an RCD. In a power distribution system, at least one such current breaker is provided, controllable by a controller, which may be remote from the current breaker.

15 Claims, 21 Drawing Sheets

(56) References Cited

U.S. PATENT DOCUMENTS

| | | | |
|---|---|---|---|
| 7,164,263 B2 * | 1/2007 | Yakymyshyn | G01R 15/207 |
| | | | 324/117 H |
| 8,300,369 B2 | 10/2012 | Hamer | |
| 2008/0073187 A1 * | 3/2008 | Rezac | H01H 9/223 |
| | | | 200/43.14 |
| 2010/0001716 A1 | 1/2010 | Serpinet et al. | |
| 2011/0286154 A1 * | 11/2011 | Coffey | H02J 1/108 |
| | | | 361/643 |
| 2012/0169328 A1 * | 7/2012 | Williams | G01R 15/20 |
| | | | 324/251 |
| 2013/0119972 A1 * | 5/2013 | Maguire | G01R 35/005 |
| | | | 324/74 |

\* cited by examiner

ISOMETRIC VIEW

FRONT VIEW

POWER DISTRIBUTION SYSTEM AND METHOD, AND CIRCUIT BREAKER FOR USE THEREIN

CROSS REFERENCE TO RELATED APPLICATIONS

This is a national stage filing in accordance with 35 U.S.C. § 371 of PCT/AU2013/001467, filed Dec. 13, 2013, which claims the benefit of the priority of Australian Provisional Patent Application No. 2012905447, filed Dec. 13, 2012, the contents of each are incorporated herein by reference.

FIELD OF THE INVENTION

The present invention relates to a circuit breaker, and in particular, to a miniature circuit breaker (MCBs). Specifically, the present invention relates a circuit breaker which is of 'standardised' physical size, and which is programmable to cater for a wide variety of current/voltage/power ratings. The circuit breaker of the present invention is preferably remotely controlled, monitored, and/or programmed.

The present invention also relates to a power distribution system and method, which includes at least one such programmable circuit breaker, for the protection, adjustment, control and/or the monitoring of power and associated parameters of at least one load.

The present invention, in particular, relates to a programmable circuit breaker, and to a power distribution system and method, which includes at least one Hall-Effect sensor.

BACKGROUND OF THE INVENTION

Circuit breakers are used to protect electrical circuits from damage caused by overload or short circuit. The function of a circuit breaker is to sense a fault, and to immediately discontinue the flow of electric current. After removal of the fault condition, a circuit breaker may typically be reset to thereafter resume normal operation.

Circuit breakers come in a wide variety of current/power ratings and tend to be grouped according to these ratings. The largest devices of this group are air circuit breakers (ACBs). These typically are rated from 1,600 amps to 6,300 amps and are typically used in large feeder circuits to distribution assemblies. Another group is molded case circuit breakers (MCCBs) which are typically rated from 16 amps 1,600 amps. These are typically used for feeding large equipment, sub-distribution ports etc. The last group is used for final distribution and are typically used to protect light circuits, powerpoints, in homes, factories, and offices. These devices are referred to as miniature circuit breakers (MCBs).

The present invention is primarily directed towards MCBs.

Circuit breakers specifications vary substantially depending on a number of factors, including their current ratings. Manufacturers typically manufacture a wide variety of internal components for circuit breakers. Circuit breakers typically vary in conductor size and coil windings, depending upon the current rating and trip characteristics.

In installations or commercial premises, circuit breakers are typically housed at centralized distribution boards. Various meters are also often housed in the distribution board, to enable monitoring of the quantity and quality of power utilized in the premises. Sometimes, control circuitry is additionally provided at or in association with the distribution board to control the operation of one or more electrical circuits within the premises.

A Hall-Effect sensor is a transducer that varies its output voltage in response to a magnetic field. Hall-Effect sensors are used for proximity switching, positioning, speed detection, and current sensing applications.

In its simplest form, the sensor operates as an analog transducer, directly returning a voltage. With a known magnetic field, its distance from the Hall plate can be determined. Using groups of sensors, the relative position of the magnet can be deduced.

SUMMARY OF THE INVENTION

The present invention seeks to provide a programmable circuit breaker.

The present invention also seeks to provide a circuit breaker which may be of standardised physical size but can cater for a wide variety of current/voltage/power ratings, and trip characteristics.

The present invention seeks to provide a circuit breaker which incorporates at least one Hall-Effect sensor.

The present invention also seeks to provide a circuit breaker which may be programmed, monitored and operated remotely.

The present invention also seeks to provide a power distribution system and method which incorporates at least one such programmable circuit breaker.

The present invention also seeks to provide a power distribution system and method, which includes a controller to sense parameters of a load, and, in the event of exceeding predetermined values, operate a circuit breaker.

The present invention also seeks to provide a power distribution system and method, in which the predetermined parameters maybe preset and thereafter adjusted by a user.

The present invention also seeks to provide a power distribution system in which the various parameters may be monitored.

The present invention also seeks to provide a circuit breaker which may have electrical parameters such as, but not limited to, power, current, voltage, demand, frequency along with status, pretrip alarm, and residual current remotely monitored.

In one broad form, the present invention provides a programmable circuit breaker, including:
an input unit, for user input and/or adjustment of predetermined load parameters;
a sensor, to sense actual values of a load; and
a microcontroller to receive and process said values, and operate said circuit breaker when said sensed values exceed said predetermined load parameters.

Preferably, said sensor includes at least one Hall-Effect sensor.

Also preferably, the circuit breaker is programmable to operate at a range of current ratings, preferably, but not limited to between 4 A to 100 A.

Also preferably, the circuit breaker is adapted to be programmed remotely.

Also preferably, the circuit breaker is adapted to be monitored remotely.

Also preferably, the circuit breaker is adapted to be tripped remotely.

Preferably, the circuit breaker includes a built in Residual Current Device (RCD) that can be adjusted to turn on or off, or to operate at a range of currents, preferably, but not limited to 10 mA, 30 mA, 100 mA.

Also preferably, the circuit breaker includes a built in lock mechanism, preferably, but not limited to multiple 6 mm padlocks Preferably, the circuit breaker includes a display unit, such as but not limited to an LCD display, to display said predetermined load parameters, said actual valves and/or other indicia.

In a further broad form, the present invention provides a power distribution system, including:

a power supply;

a controller, for user input and/or adjustment of predetermined load parameters;

at least one load;

a circuit breaker associated with each said load, to selectively connect said power supply to each load, each circuit breaker including:

an input means, to receive said predetermined load parameters from said controller;

a sensor, to sense actual value of a load; and a microcontroller to receive and process said values, and operate said circuit breaker when said sensed values exceed said predetermined load parameters.

Preferably, at least one of said circuit breakers includes a Hall-Effect sensor.

Also preferably, at least one of said circuit breakers is programmable to operate at a range of current values, preferably, but not limited to between 4 A and 100 A.

Also preferably, said controller is located remotely from said circuit breaker(s).

Also preferably, said circuit breaker includes interlocking to prevent the circuit breaker being added or removed whilst in the "on" position.

Also preferably, the distribution system includes a communications channel, such as, but not limited to a wireless communications channel, for remote programming, monitoring and/or tripping of said circuit breaker(s) via said controller.

Preferably, said circuit breaker(s) include a residual current device (RCD).

Also preferably, said current breaker(s) includes a locking mechanism.

Also preferably, said current breaker(s) includes a display unit to display said predetermined load parameters.

BRIEF DESCRIPTION OF THE DRAWINGS

The present invention will become more fully understood from the following detailed description of preferred but non-limiting embodiments thereof, described in connection with the accompanying drawings, wherein.

DETAILED DESCRIPTION OF PREFERRED EMBODIMENT

Overview of the Circuit Breaker

The present invention provides a circuit breaker which incorporates a number of features which enable it to be physically constructed to be of a standardised size and shape, whilst being suitable to operate electronically to cater for a wide variety of current/voltage/power ratings, and trip characteristics.

The circuit breaker of the present invention is unique from prior art circuit breakers in that it utilizes Hall-Effect sensors, which enable the electronic requirements of the circuit breaker to be implemented for outcomes not currently available.

The circuit breaker of the present invention is able to be programmed such that it can operate at a range of current/voltage/power ratings, and trip characteristics. It may be programmed in situ, remotely, or pre-programmed to its desired ratings.

The circuit breaker of the present invention is also able to be monitored remotely, to determine the power consumption, along with other parameters, remote from the location at which the circuit breaker is installed.

The circuit breaker of the present invention combines the features of multiple add-on devices and additional features to provide the outcome without increase in size to the present invention or the addition of these components.

Physical Characteristics of the Circuit Breaker

The circuit breaker of the present invention is able to be programmed to suit a wide range of current/voltage/power ratings, but, in a 'standardised' size physical casing.

Figure 1:
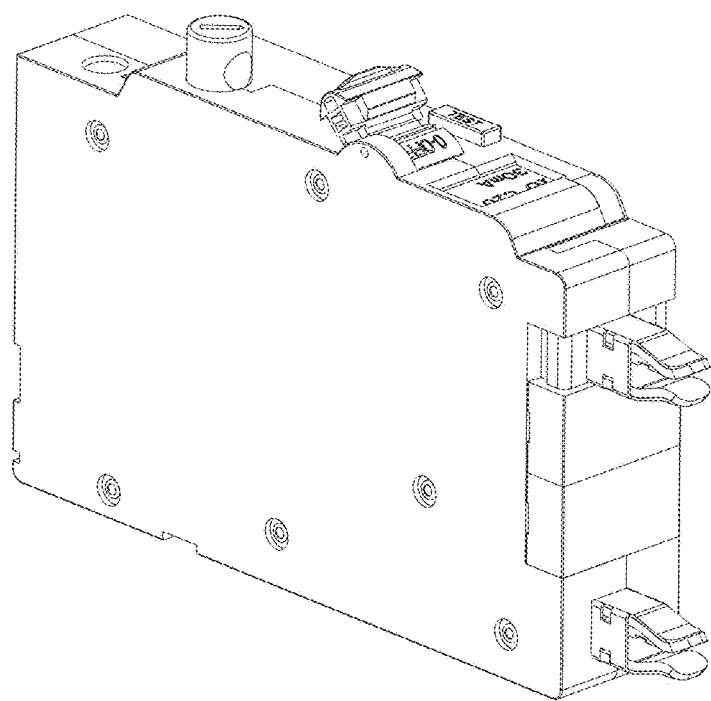
FIG. 1 shows a circuit breaker, constructed in accordance with the present, invention.
Figure 2:
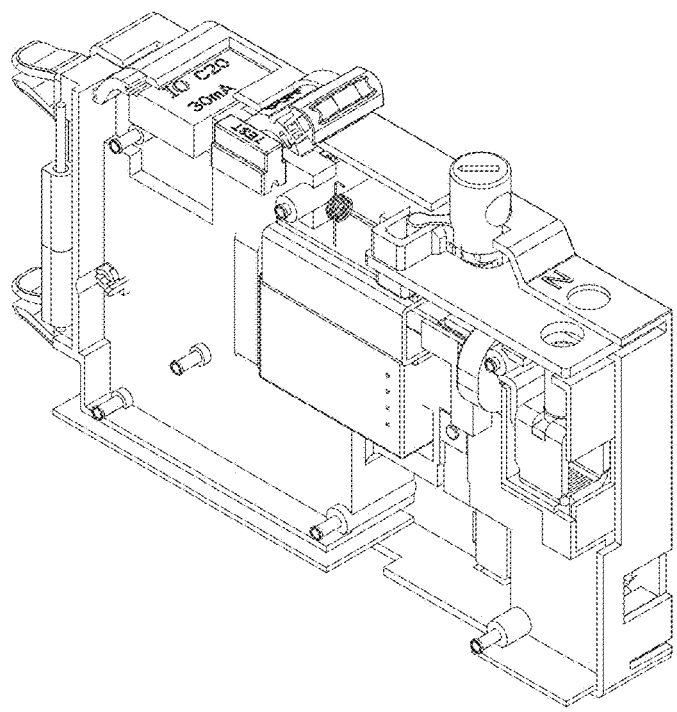
FIG. 2 shows the circuit breaker of FIG. 1, but with its casing partially removed to reveal the various internal components.

The physical housing is shown in FIG. 1, with FIG. 2 showing the casing partially removed to display the various mechanical and electrical components housed therein.

By constructing a standardised manufactured product for the circuit breaker, significant cost savings are gained during the supply and assembly of the circuit breakers, as the need to have a significant variation to internal mechanisms and components is overcome. This is achieved as the electronic components provided in the circuit breaker casing of the present invention are 'standardised', being programmable to set different parameters, including current ratings.

Electronic Configuration of the Circuit Breaker

Figure 3:
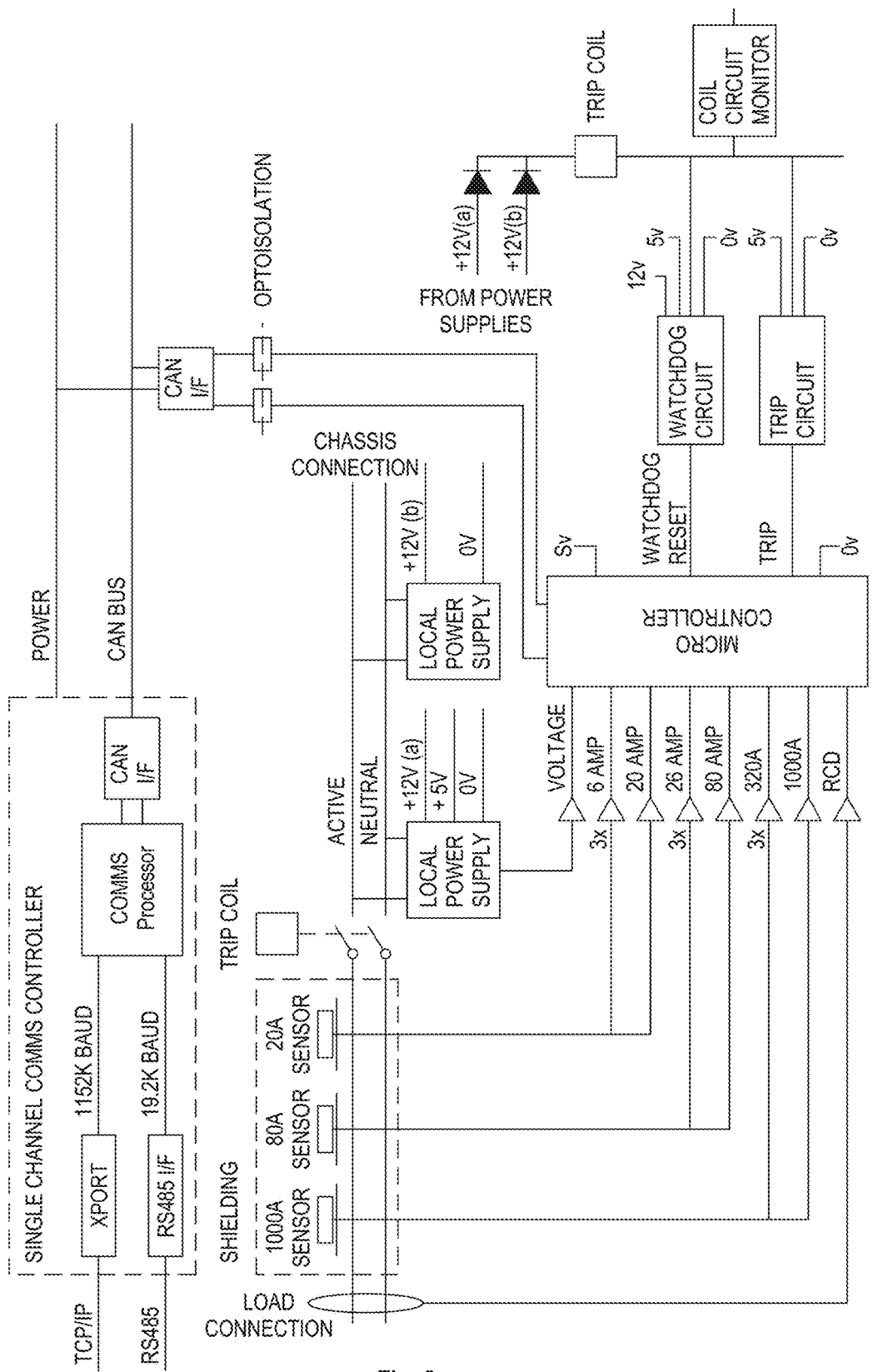
FIG. 3 shows a block diagram of the main component parts of the power distribution system of the present invention.
Figure 4:
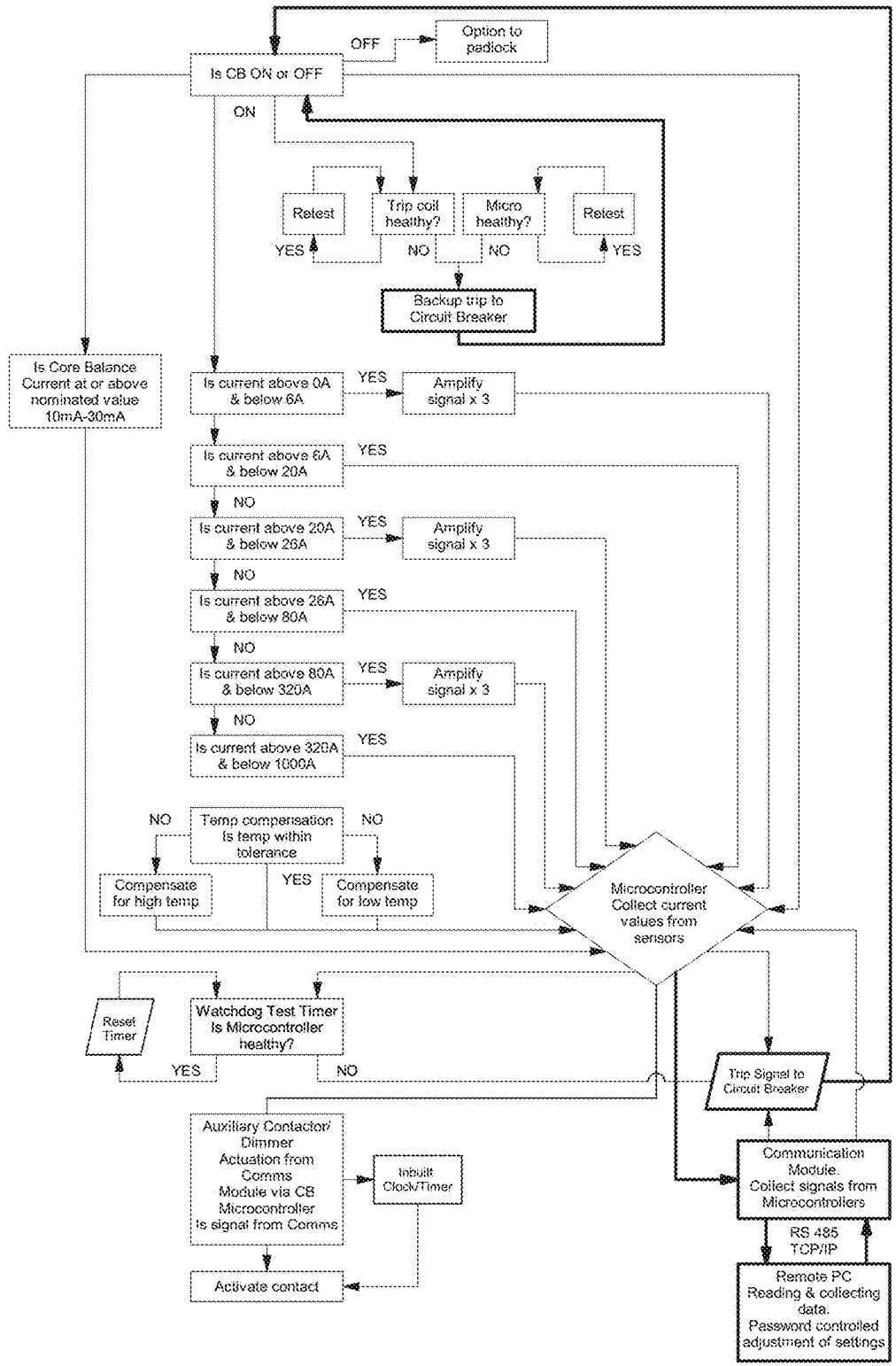
FIG. 4 shows a flowchart showing a simplified operation of the power distribution system of the present invention.

FIG. 3 shows a block diagram of the main electronic component parts of a preferred but non-limiting embodiment of the power distribution system of the present invention, whilst FIG. 4 shows a flowchart describing its operation.

As seen in FIG. 3, the circuit breaker of this embodiment of the present invention operates by utilizing three Hall-Effect current sensors to detect and monitor the current flow.

The use of Hall-Effect current sensors enables the electronic configuration of the circuit breaker to be enabled taking up a small physical space.

The circuit breaker of the present invention, which includes the Hall-Effect sensors therein, operates as follows:

The current sensing arrangement is made up of three electronic Hall-Effect current sensors to provide accuracy and resolution over a wide scale of values in a single device.

Each of the sensors has two amplifier circuits attached to provide output to a microcontroller.

The conductor is provided with a field concentrator in the form of a ferromagnetic material around three sides of the conductor directing the magnetic field to the sensor before running to sensor 2.

Sensor 2 is provided with a single pass at a predetermined angle.

Sensor 3 is provided with a single pass with the sensor positioned at a deflected angle to provide a calculated desensitizing of the sensor and the fifth and sixth current range.

All three current sensors are provided with a ferromagnetic shield to prevent interference and inaccurate readings from adjacent and surrounding equipment.

Current passes through the moving (trip) contact of the circuit breaker and over the range of Hall-Effect sensors. The sensors monitor the current and provide an output voltage. The output voltage is sent to the amplifier circuits before. registering in the microcontroller of the circuit breaker.

The microcontroller is programmed at manufacture to a particular code allowing the setting of values to provide the tripping functions and monitoring functions of the device.

Specific software is used to set each of the devices with the parameters previously mentioned.

The circuit breaker is an intelligent module that monitors the voltage and current in a circuit to provide overload protection.

The circuit breaker is configurable over a wide range of currents and trip characteristics with the one module.

The full load current is set with the microcontroller along with the trip characteristics, RCD if required.

The monitoring circuits read true RMS voltage and current and provide power reading at regular intervals.

Statistical voltage, current and power readings are sent to the communications controller via the CAN bus' interface.

All of the circuit breaker modules within a system can be monitored and controlled by a common communications controller, that may be connected to a central computer for display of individual circuit parameters.

The communication controller is able to provide power and current values for a predetermined group of two or more circuits to allow monitoring of power consumption and other relevant parameters for groups such as, but not limited to, light, power, mechanical services, tenant etc without the need to split the chassis supply.

Circuit Breaker Components

Microcontroller

The microcontroller contains the CPU, FLASH Memory, EEPROM, RAM, Timers, CAN bus controller and Inputs, Outputs.

The CPU executes code from the FLASH Memory and uses the RAM to store data gathered from the external circuits for the voltage and current monitoring.

The EEPROM is used to hold the calibration constants for the voltage and current monitoring.

The timers control the operation of the code to perform the required functions at the correct time.

The CAN bus controller is used to communicate with other circuit breakers (for 3 Phase operation) and to send voltage, current and power readings to the communications controller for monitoring of the system.

The Input, Output interface is used to read and control external circuits and to read the analogue circuits from the Voltage and current monitoring.

Voltage Monitor

The switched mains voltage is monitored by the voltage monitoring circuits to determine the present mains voltage.

This circuit converts the mains voltage to a level that is read by the analogue to digital converter within the microcontroller.

Current Monitor

The current monitoring is performed in six ranges.

The circuit breaker contains three current monitoring devices that have different coupling to the main active current path through the circuit breaker.

Each of these three sensors are each connected to two amplifiers of different gains.

The output from the six amplifiers is connected to the analogue to digital converter within the microcontroller.

CAN Bus Interface

The CAN bus controller, within the microcontroller is connected to an external circuit that is connected to the common CAN bus on the backplane.

The CAN bus connects all of the individual circuit breaker to each other and to the common communications controller.

Watch Dog Timers

There are two different watch dog timers used to ensure correct operation of the circuit breaker.

The first is contained with the microcontroller and is reset when all internal operations have been completed correctly.

The second is an external circuit that is monitoring the correct operation of the microcontroller. If this external circuit detects the microcontroller is not operating correctly this circuit will trip the circuit breaker switch.

Backplane Interface (Chassis)

The backplane connects all of the circuit breaker together and to the communications controller.

The backplane contains common signals for the CAN bus and power to the CAN bus circuits and special signals to allow the communications processor to send special messages to the circuit breaker microcontroller for remote loading the operating firmware.

The backplane also provides the keying to the circuit breaker microcontroller to individually identify each module.

Power Supply

Mains Off Line Power Supply (Optional)

The circuit breaker contains a switch mode power supply that is connected to the un-switched mains supply to provide power to the microcontroller and other circuits.

External Power Supply (Optional)

The circuit breaker may alternatively be powered from a dual redundant external common power supply to provide power to the microcontroller and other circuits.

Ancillary Power Supply

The circuit breaker contains a second power supply that provides power to the second watch dog timer circuits and trip circuit.

If the main power supply fails, the ancillary power supply will run the second watch dog circuit to allow the circuit breaker to trip to the OFF position.

Low Voltage Regulator

The Bulk DC supply from the main or external power supply is regulated to power the Microcontroller and other circuits.

Trip Circuit

The trip circuits are driven by the microcontroller and the watch dog timer to operate the trip coil to turn the CB OFF.

Ancillary Circuits Interface

The ancillary circuits interface provides connections to external modules that are controlled by the CB.

The external modules are light dimmers, relay or contact closure devices.

There are two additional analogue to digital converter inputs to the microcontroller for measuring external sensors.

The interface is provided with a connection to the microcontrollers SPI bus for connection to external intelligent modules.

Display LEDs

The circuit breaker is provided with three LED indicators, that are under the control of the firmware, and will indicate the current operation of the CB.

Mains Frequency Interrupt

The microcontroller is connected to a circuit that will provide an interrupt at the mains frequency for synchronisation of internal operations.

Boot Circuit

The boot circuit is provided to allow the remote upgrade of the firmware in all. CB connected to the communications controller.

Circuit Description

Microcontroller

Figure 12A:
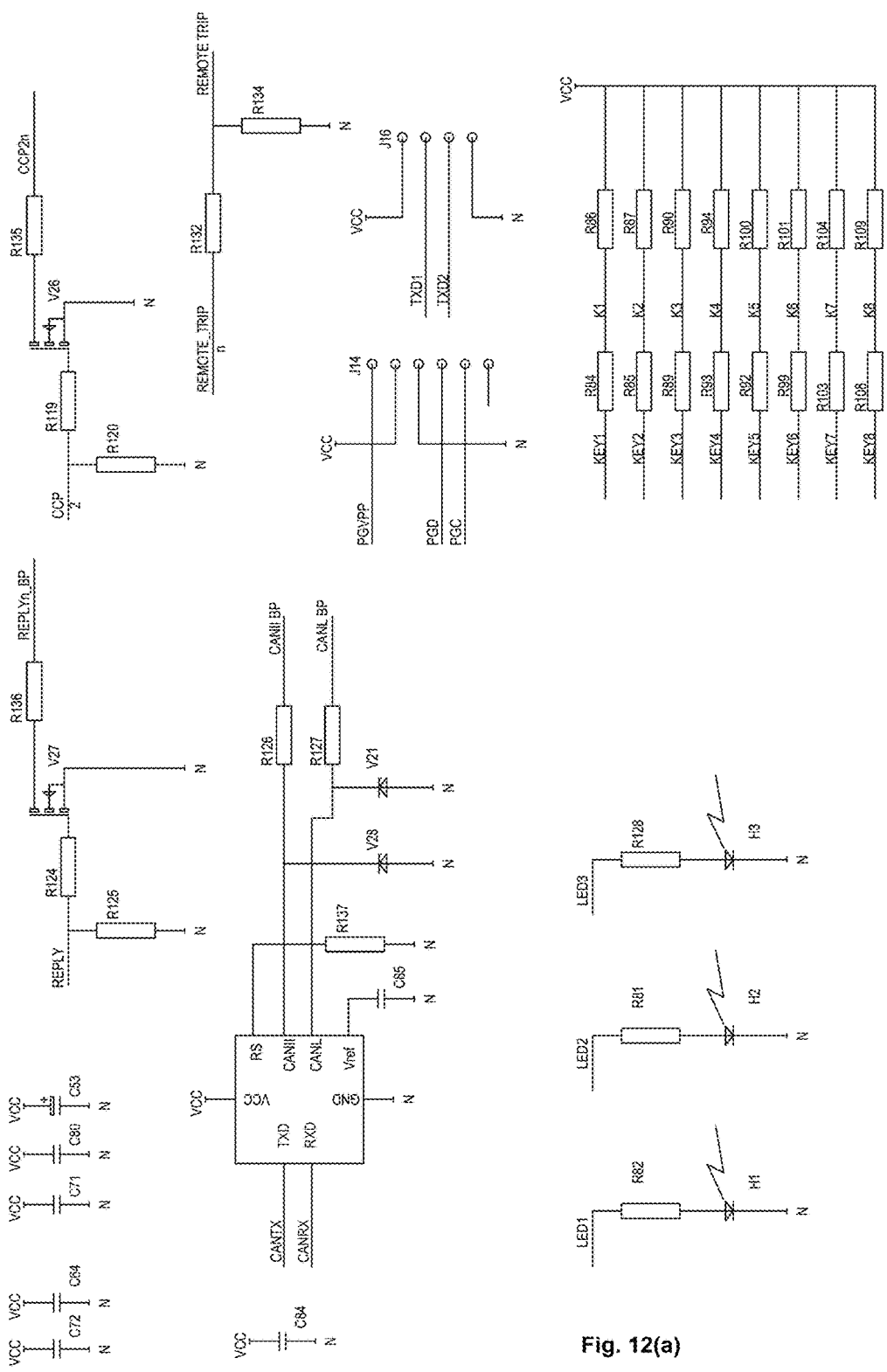
FIG. 12 shows details of the main CPU.
Figure 12B:
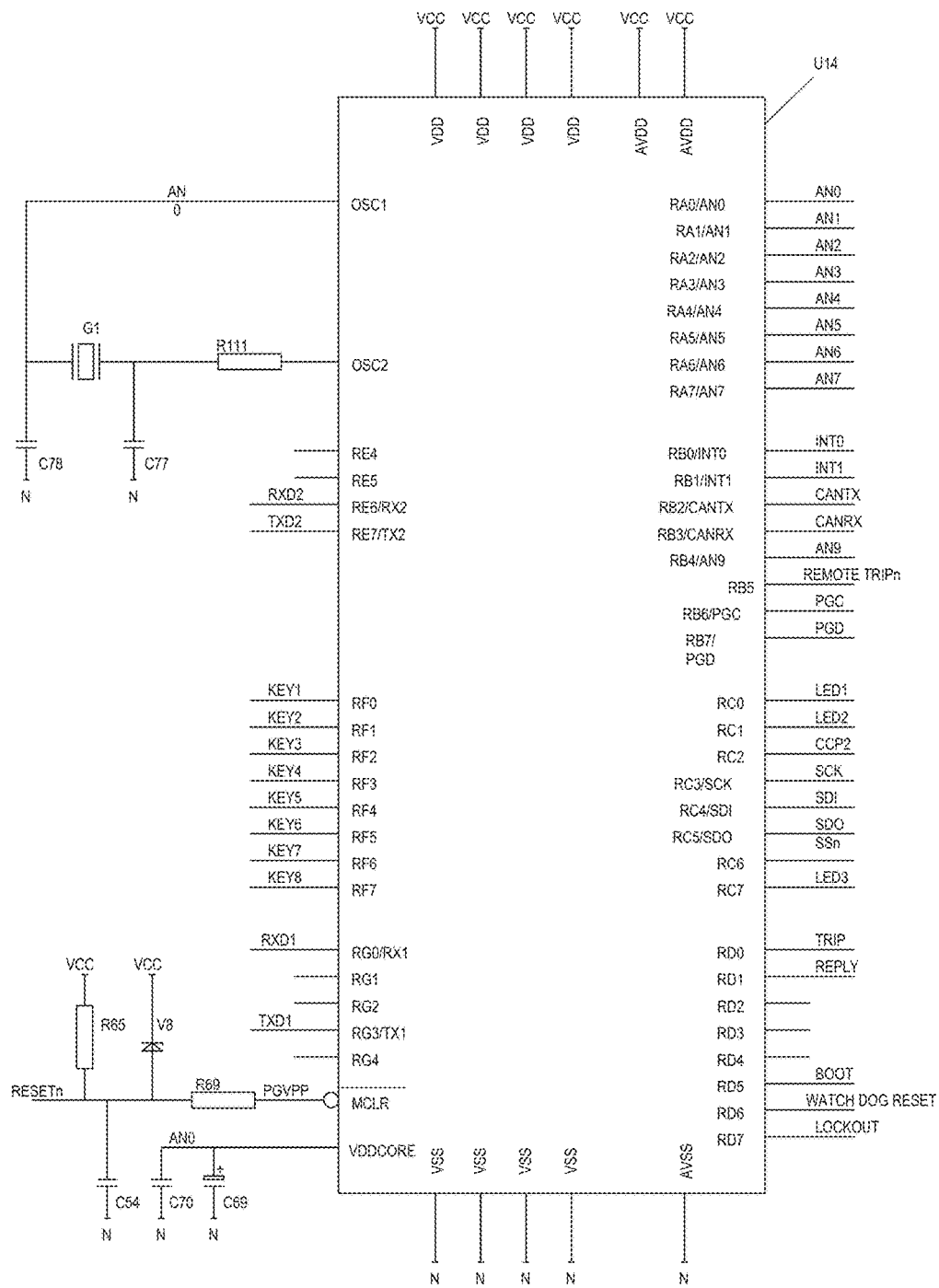

The micro controller is shown in FIG. 12(b).

This circuit has an external 16 Mhz Crystal G1 along with the capacitors C77, C78 and R111 for a crystal oscillator.

The microcontroller reset circuit R65, R69, V8 and C54 provides a delayed start up when power is first applied.

The internal core of the microcontroller operates at a low voltage with C69 and C70 providing filtering for the internal regulator.

Each power supply pin to the microcontroller is bypassed with a capacitor C68, C71, C72 and C80.

Voltage Monitor

Figure 13A:
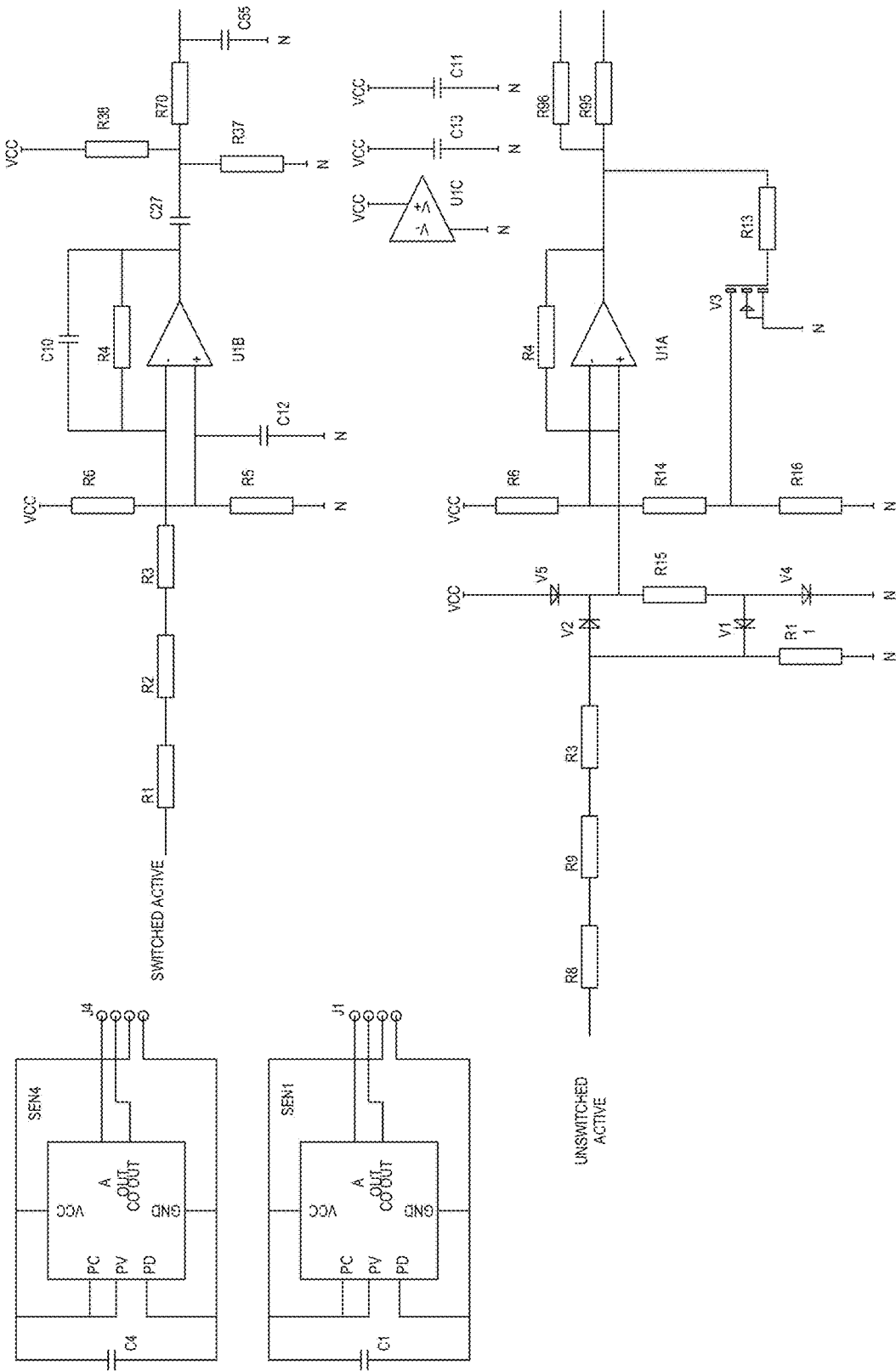
FIG. 13 shows preferred implementation details of a voltage and current sensor.

A typical voltage monitor circuit is shown in FIG. 13(a). This can vary with changes in power supplies.

The high voltage from the switched active is dropped to a lower voltage by R1, R2 and R3. This lower voltage is connected to the buffer amplifier U1B with feedback resistor R4 and filtering capacitor C10.

The amplifier is biased to half rail by resistors R5 and R6, filtering of the bias supply is provided by C12.

The amplifier is AC coupled to the analogue to digital converter by C27. The ADC is biased to half rail by R37 and R38. Additional filtering is provided by R70 and C55 before the signal is connected to the microcontroller.

Current Monitor

Figure 13B:
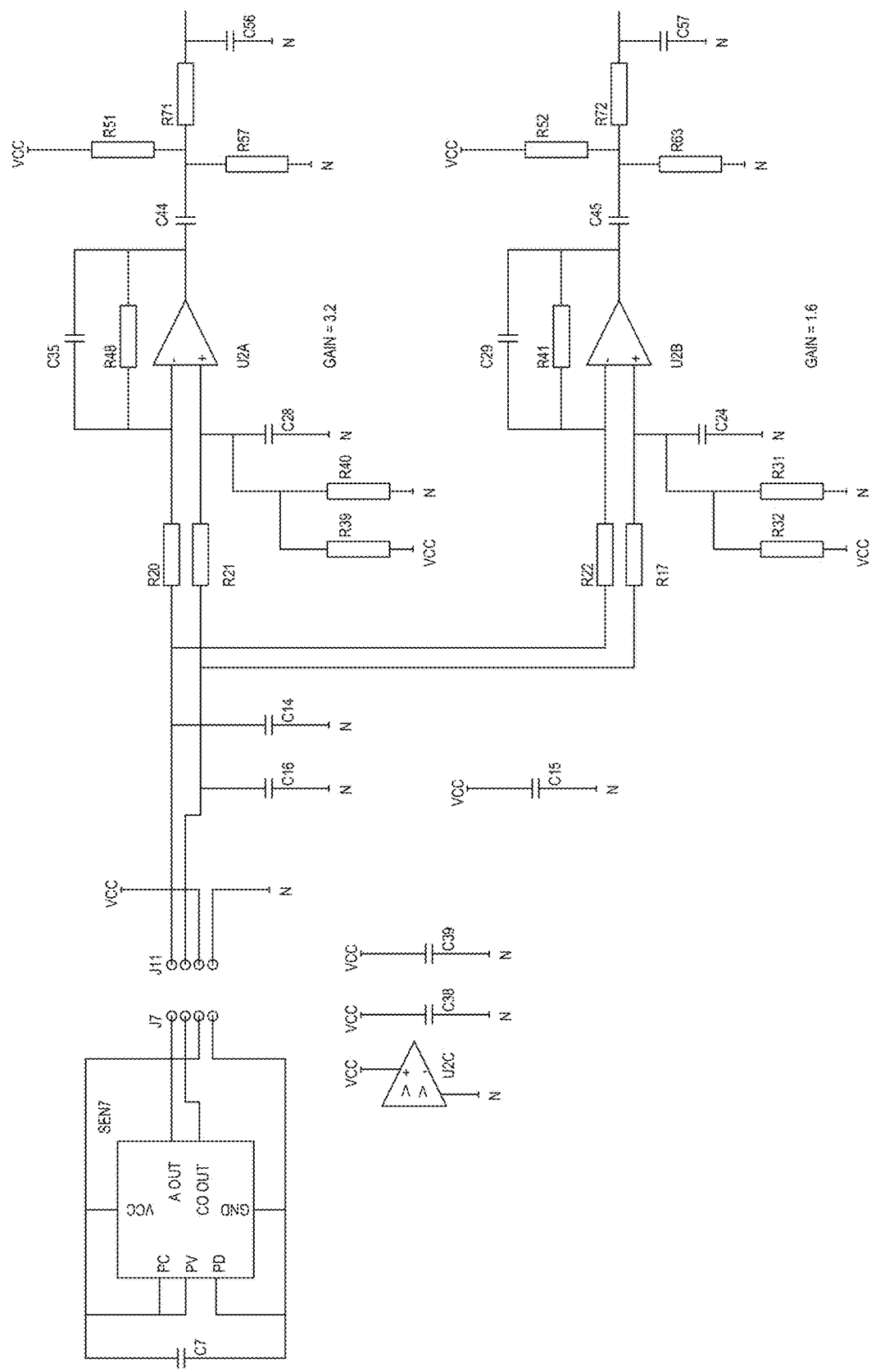
Figure 14A:
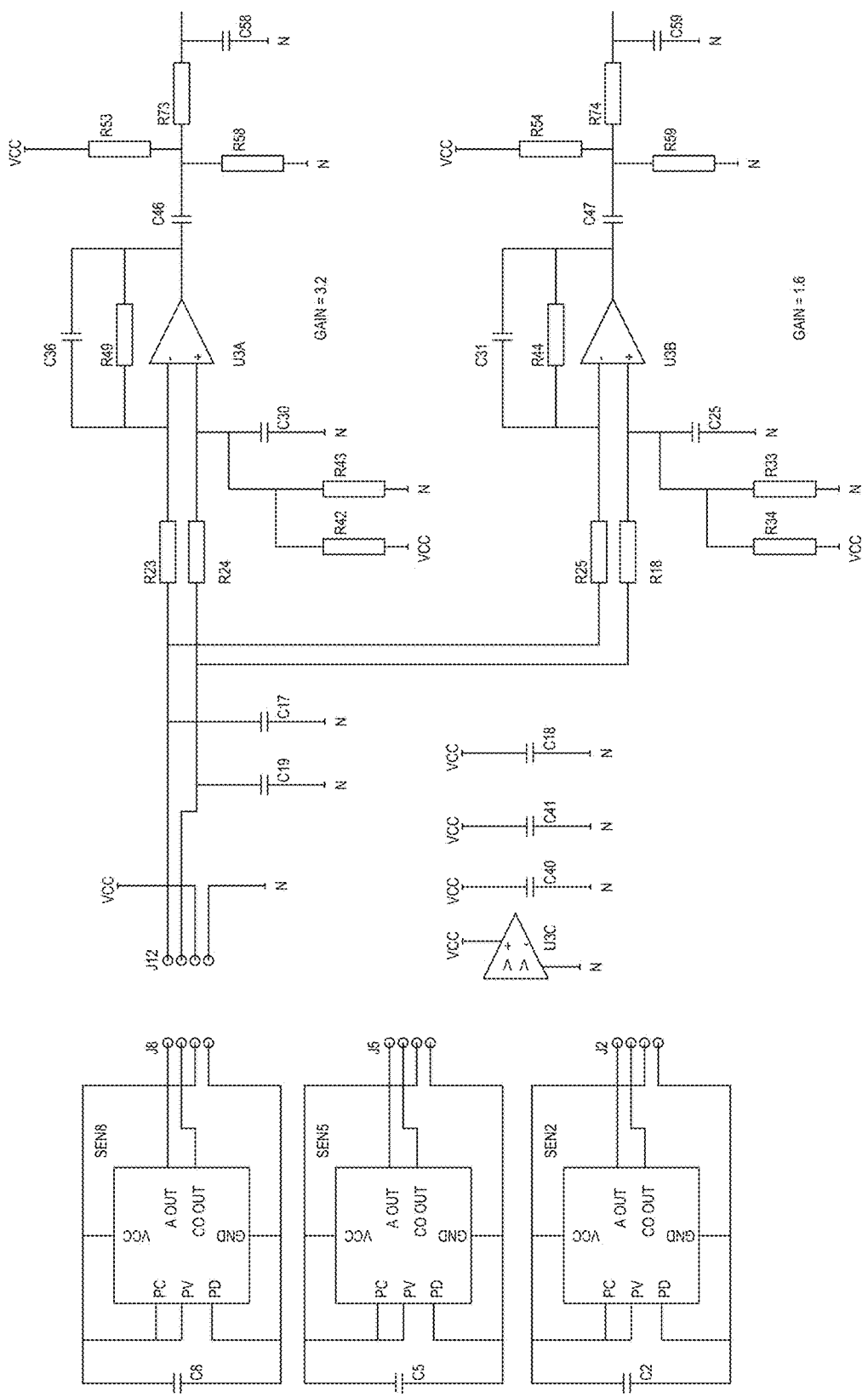
FIG. 14 shows preferred implementation details of the second and third current sensors.
Figure 14B:
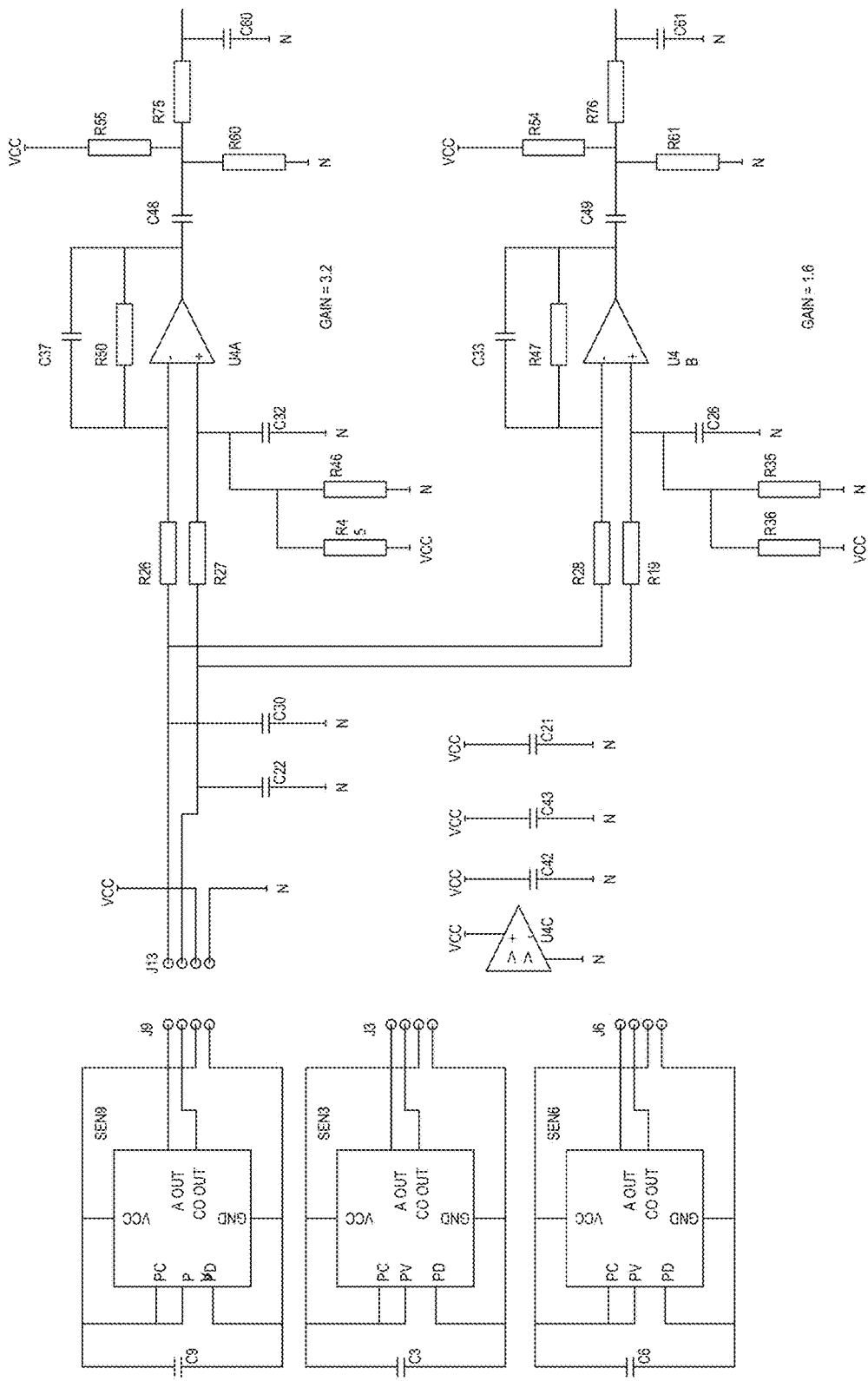
Figure 15:
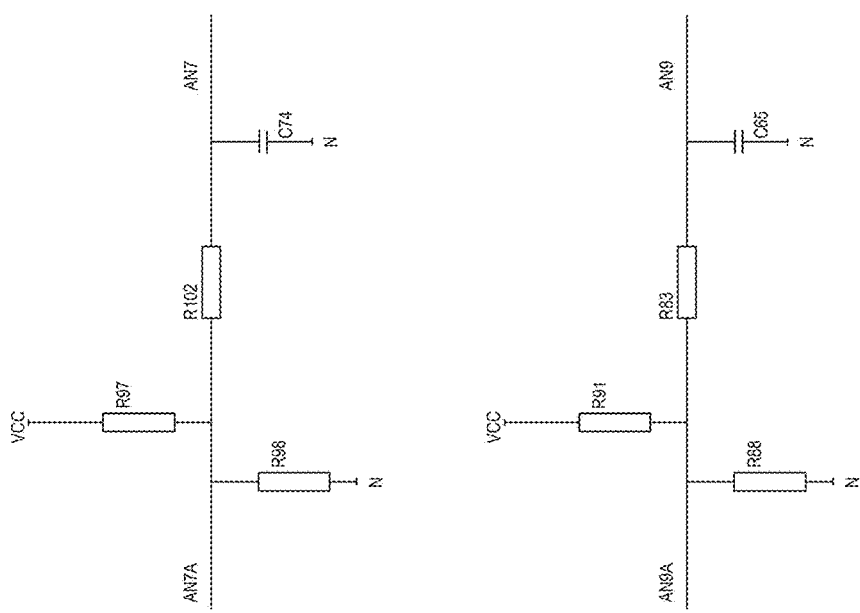
FIG. 15 shows circuit implementation details of a preferred arrangement of an RCD amplifier.

The current monitor circuits are shown in FIGS. 13(a) and 13(b).

The current sensor SEN1, is magnetically coupled to the active conductor through the circuit breaker.

The output from the sensor is connected to two amplifiers, U2A and U2B.

The gain of the two amplifiers is set by R20/R48 and R22/R41, with filtering provided by C24, C28, C29 and C35.

The amplifiers are biased to half rail by the common output from the sensor.

The output from the amplifiers is then AC coupled to the ADC by C44 and C45. The ADC is biased to half rail by R51, R57, R52 and R62. Filtering is provided by R71/C56 and R72/C57.

The second and third current sensors have different coupling to the active conductor to provide higher current ranges.

CAN Bus Interface

The CAN bus interface circuits are shown in FIG. 12(a).

The CAN bus interface U16 converts the single ended TTL signals to and from the microcontroller, into the differential signals for the common CAN bus.

The interface IC is protected from spikes on the backplane by R126, R127, V21 and V28.

Watch Dog Timer

The first watch dog timer is contained with the microcontroller U14 in FIG. 12(b).

Figure 17:
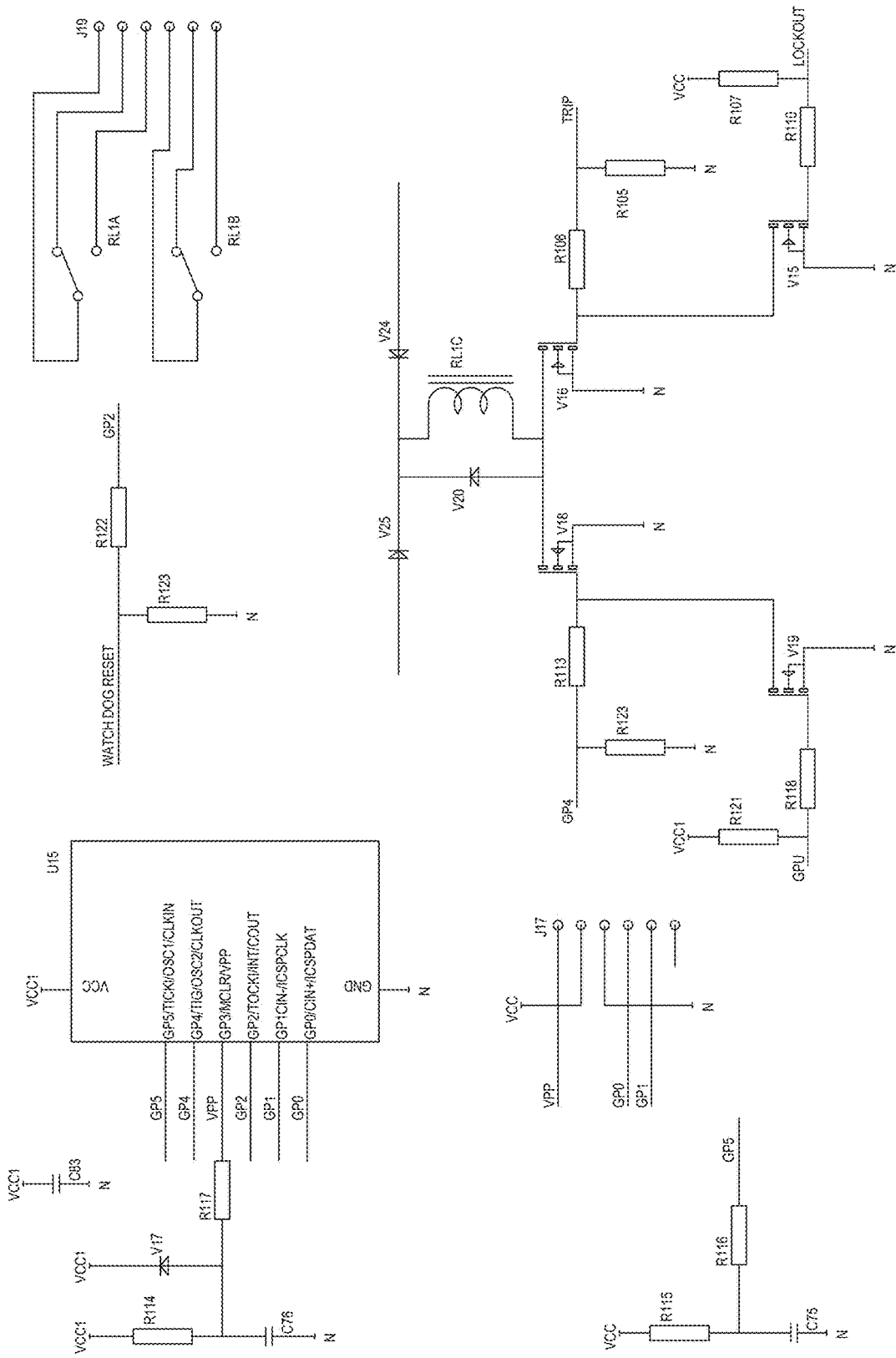
FIG. 17 shows preferred implementation details of a trip circuit.

The second watch dog time is U15 in FIG. 17.

This circuit operates with an RC oscillator circuit formed by R115, R116 and C75.

This time is connected to the microcontroller U14 in FIG. 12(b) by the watch dog reset signal. The microcontroller must toggle this control line at regular intervals to prevent the circuit from tripping the circuit breaker switch.

The watch dog timer circuit is connected to the first half of the trip circuit.

Backplane Interface

Figure 11A:
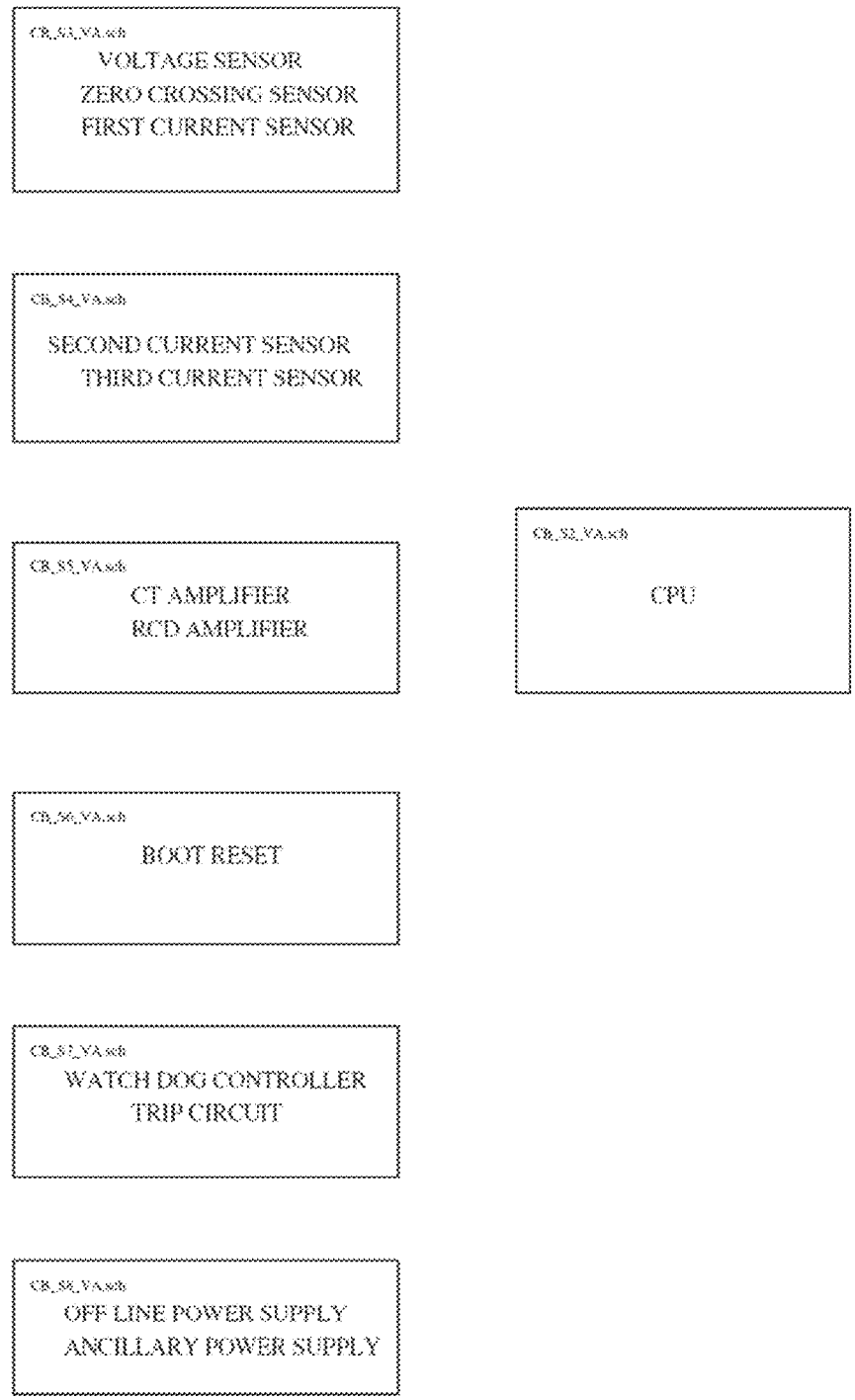
FIG. 11 shows the main component blocks of the circuit breaker of the present invention and some circuit implementation details thereof.
Figure 11B:
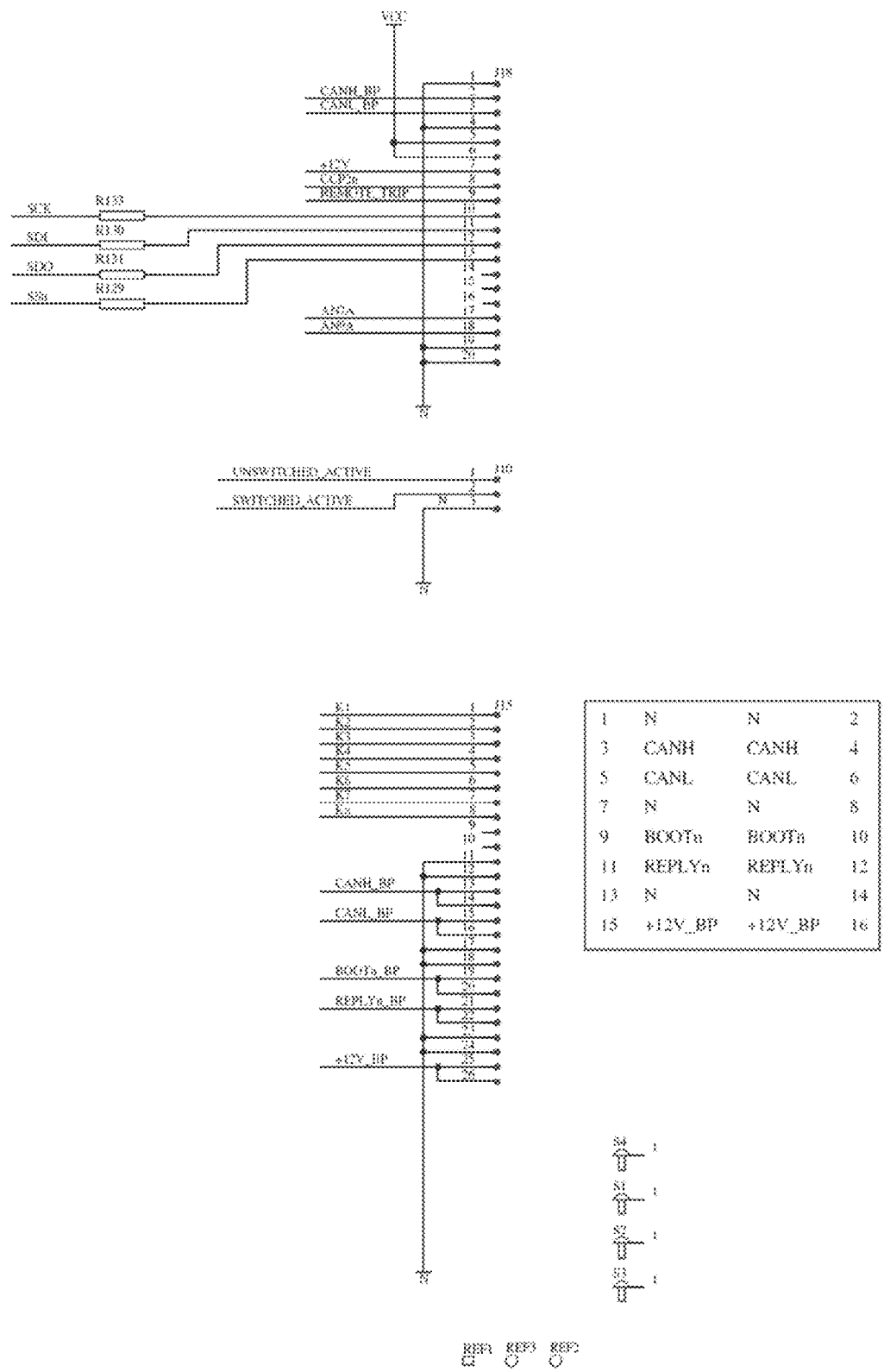

The backplane connector is shown in FIG. 11(b).

This connector provides connections to the slot keying on the first half of the connector and connections to the common bus on the second half of the connector. It will be understood that this may vary with different plug arrangements.

The connector also provides phantom power from each CB to the common CAN bus interface on the communications processor.

Power Supply

Mains Off Line Power Supply (Optional)

Figure 18:
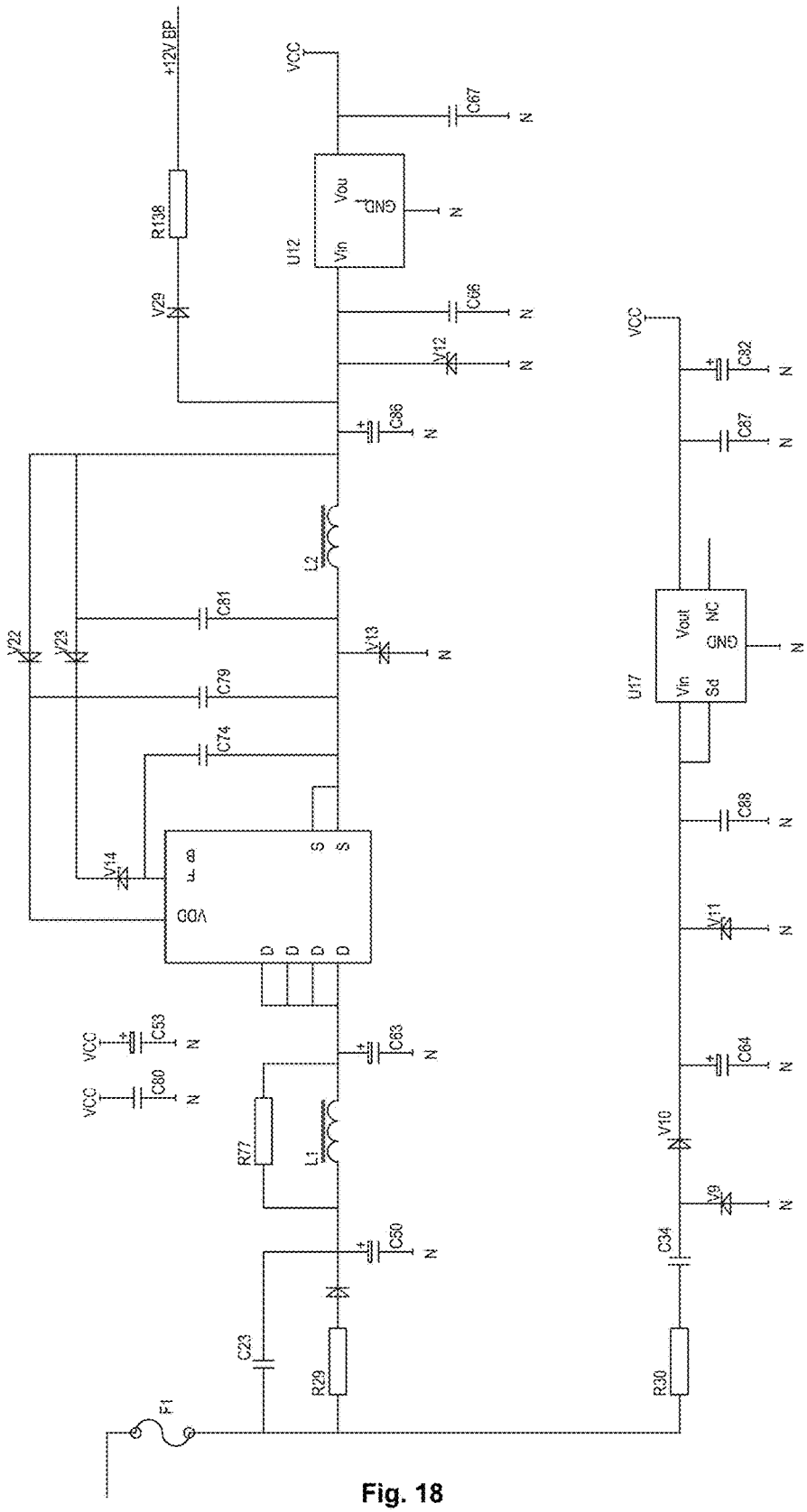
FIG. 18 shows a preferred implementation details of a power supply for use in the device of the present invention.

The mains power supply is shown in FIG. 18.

The mains voltage is applied to the circuit through Fuse F1. The mains is rectified and filtered by V6 and C50. EMC Filtering is provided by C50 L1 and C63.

The switch mode power supply control is provided by U13.

The switched output is filtered by L2 to charge C86.

External Power Supply (Optional)

The circuit breaker may, if a remote power supply is provided, operate from the dual redundant power supply connected to the backplane. In this case the mains offline power supply circuits will not be fitted.

The power supply will be connected to the backplane connector and applied to the internal regulator through R138 and V29.

Ancillary Power Supply

The ancillary power supply is shown in FIG. 18.

This power supply will convert the un-switched mains to a low voltage supply to operate the second watch dog timer and trip circuit.

The mains supply is rectified C34, V9, V10 and C64 to provide the supply the trip coil and then further regulated by U17 to a lower voltage to power the watch dog timer circuits.

Low Voltage Regulator

The low voltage regulator U12 is shown in FIG. 18.

This circuit regulates the voltage from the main power supply (internal or external) to a lower voltage to operate all of the CB circuits.

Trip Circuit

The trip circuit is shown in FIG. 17.

The trip circuit has two circuits in parallel, where either circuit can trip the CB.

Both circuits are identical in operation, with the first half operated by the microcontroller and the second half operated by the watch dog timer.

The main trip switch is V16 or V18, when a high logic level is applied to the gate of the FET, the trip coil is activated.

To enable the trip switch, the lockout signal must be removed by applying a low logic level to the lockout FET switch V15 and V19.

When power is first applied to the CB the resistors R107 and R121 ensure that the lockout is active until the microcontroller and watch dog timer are operational.

Ancillary Circuits Interface

The ancillary circuits connector is shown in FIG. 11(*b*).

This connector provides connections to additional modules external to the CB.

The connector provides connection to the common CAN bus, connections to the microcontroller via the SPI bus. A pulse width modulated signal for light dimming, a remote trip input from external sensors and two analogue inputs to the microcontrollers ADC.

Display LEDs

The LED display is shown in FIG. 12(*a*).

The LEDs are controlled by the microcontroller and are under the control of the firmware.

Mains Frequency Interrupt

The mains frequency interrupt is seen in FIG. 13(*a*).

The circuit is connected to the un-switched main by R8, R9 and R10. The voltage swing is limited by V1, V2, V4; V5 and R15.

This signal is applied to a voltage comparator U1A. The comparator switching voltage is set by R7, R14 and R16, with hysteresis added by V3.

The output of the comparator is connected to the microcontroller interrupt inputs through R95 and R96.

Boot Circuit

Figure 16:
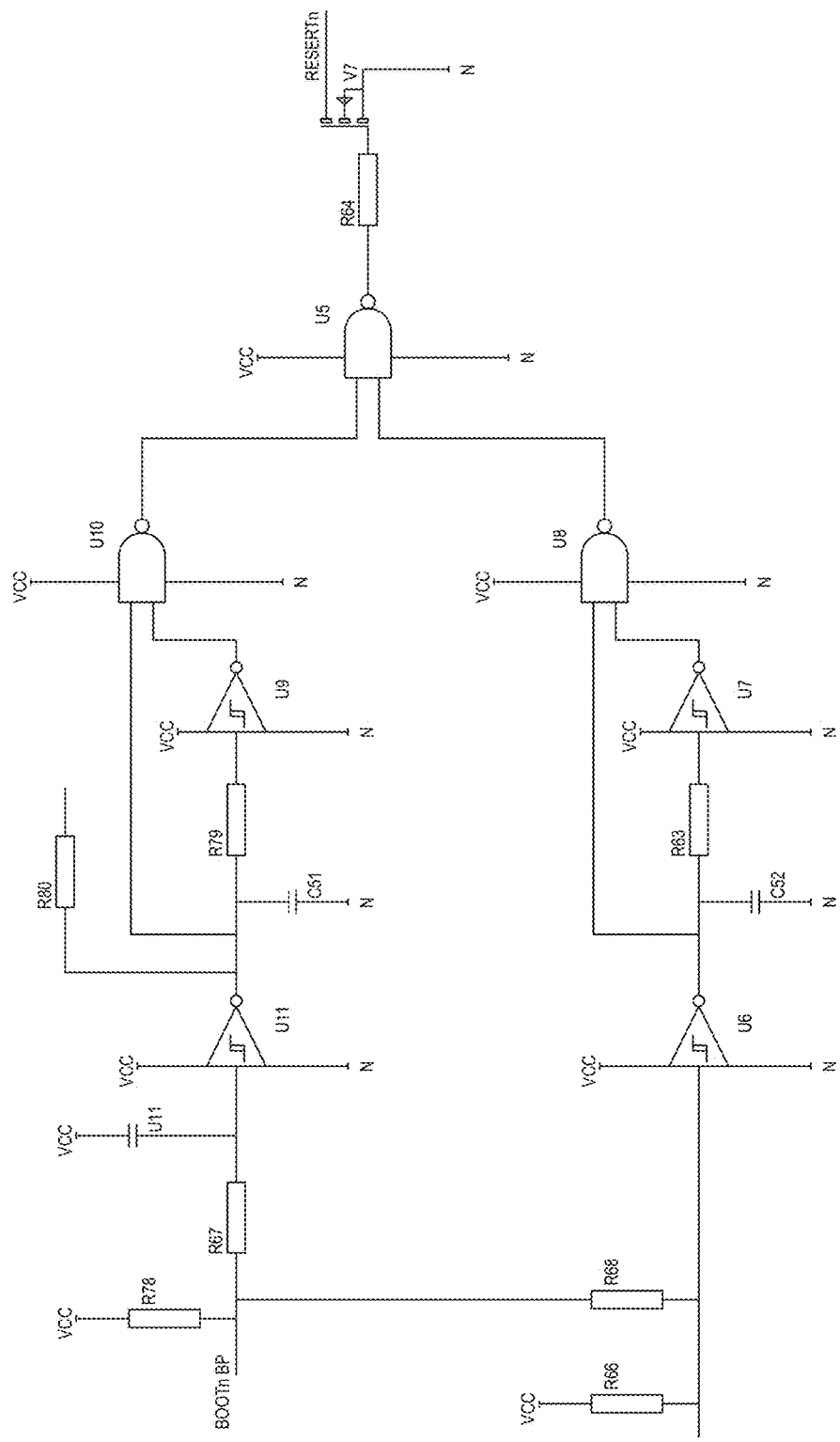
FIG. 16 shows preferred implementation details of a boot reset circuit.

The boot circuit is shown in FIG. 16.

The boot circuit is used to restart the microcontroller in a boot loader mode of operation.

The communications controller activates the boot control line to the backplane which is connected to all circuit breakers in parallel.

The boot signal is delayed by R67 and C62 and applied to the inverter U11, this provides the input to the microcontroller as BOOT.

This signal is then delayed and gated by U6, U7, U8, U9, U10 and U5 to generate a reset signal the microcontroller.

When the microcontroller starts to operate after this reset the firmware will enter BOOT Mode.

Programming the Circuit Breaker

A circuit breaker of the present invention may be programmed with a range of predetermined parameters. The parameters of the circuit breaker, which may be selected include, current rating, voltage rating, residual current (preferred but not limited to 10 mA, 30 mA, 100 mA), tripping curve characteristics, status, pre-trip alarm, trip alarm, remote trip, single phase or three phase, circuit name, circuit grouping (for group power monitoring), email detail for alarms, switching of load (either normally open, normally closed), dimming of load via external input, real time clock switching of contacts, time delay function of switching of contacts. These functions are performed by the (communications) controller. The actual circuit breaker itself will only perform the tripping function autonomously once programmed.

The circuit breaker of the present invention may be programmed via a PC, laptop, iPad® or other tablet device operatively connected to the communication controller then circuit breaker via a USB, network cable, blue tooth or other connector.

Monitoring the Circuit Breaker

The circuit breaker of the present invention may be monitored in situ, or, remotely. It is useful to monitor the circuit breaker operation because power consumption may be required to be monitored for contractual reasons, for on-billing to consumers of power where individual circuits feed different customers.

The overall accumulation of current demand can push backup systems such as UPS into bypass and remove backup from the system, pretrip alarms to advise when allowance for a particular circuit has been exceeded.

Status monitoring to advise of circuits still being active such as hospitals, security, food storage, data sites, lift and fire services.

Figure 5:
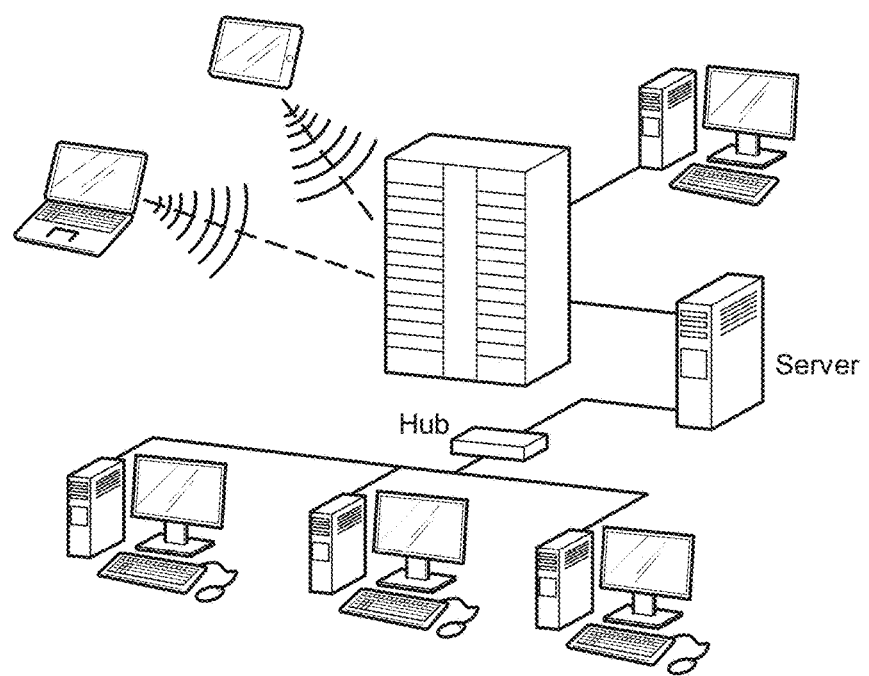
FIG. 5 shows the components/connections to monitor the circuit breaker of the present invention.

FIG. 5 shows how the circuit breaker may be monitored.

Other Features of the Circuit Breaker

RCD Protection

The traditional core balance CT principle is still useful here. Both the active and neutral pass through the core balance CT. The RCD sensor CT produces a current in the output winding proportional to the out of balance current flowing in the circuit being monitored. The microcontroller is software adjustable to provide a sensitivity of preferably but not limited to, 10 mA, 30 mA or 100 mA in the one device. Once set, the microcontroller operates independently of the Master Communication Controller.

The current from the RCD sensor CT is connected to the current amplifier U1A, C10 provides input filtering for spikes in the circuit being monitored.

Diodes V2 and V4 provide overload protection of the monitoring circuit.

The current feed amplifier U1A has a feedback path through R1 to produce a current that is equal to the current in the RCD sensing CT secondary. This current is 180 degrees out of phase to the current in the RCD sensing CT, maintaining zero volts across the RCD sensing CT secondary winding.

The capacitor C5 provides additional filtering and forms part of the low pass filter for the signal.

The output from the amplifier U1A is connected to the ADC via the coupling capacitor C4.

The circuit is biased to half rail by R3 and R5. The buffer amplifier U1B provides a low impedance half rail bias to the amplifier U1A.

Under normal operation (without RCD setting enabled) the neutral may or may not be connected to the circuit breaker neutral. There are some circumstances where you would specifically avoid switching the neutral and this will have no adverse impact.

The three phase RCD option can be used with or without a neutral. An external module is attached directly to the 3 circuit breakers containing an RCD sensing CT to provide a signal proportional to the out of balance current in the three phase circuit. This signal is fed through a current amplifier as per the single phase option and fed to the microcontroller as voltage, subsequently actuating the tripping of all 3 poles of the circuit breaker.

Load cables must pass through this module to gain access to the circuit breaker terminals; preventing the user from bypassing the RCD sensing CT.

This device will also be software adjustable in sensitivity preferably but not limited to 10 mA, 30 mA and up to 100 mA.

Each of these RCDs is able to be programmed to be automatically tested regularly for input and output. This system can then provide a monitored output via email or other function. All equipment to date, at a final distribution load is manually tested via a pushbutton on the circuit breaker with integral RCD. There is a requirement to regularly test and due to this manual operation, this action is often not undertaken.

Power Distribution Chassis

The power chassis will consist of busbar for power supply to the individual circuit breakers, a master communication controller and a communication bus or CAN bus.

The ratings may typically be 400 A and shall be constructed to withstand fault levels of 50 kA for 1 second and will be type tested and certified to this. These specific values may vary, as will be understood by persons skilled in the art.

The master communication controller will be fitted with RJ45 TCP/IP port with embedded software for generic display of parameters on a network.

The chassis shall be moulded in small sections to allow typically, but not limited to, up to 96 poles with busbar being inserted in a continuous length. Busbar is a radius corner at a size of 3 mm thick and 40 mm wide.

Busbar will be laid out as a lamination with the insulated mouldings between each phase and neutral. Flags will extend either end to allow specialized connection bars to fit directly onto main switches or upstream circuit breakers. The exposed (not used) end of the chassis system will be enclosed by a moulded cover.

The CAN bus will have additional connection points for fly leads for accessory equipment.

Power for the master communications controller is preferably provided by an internal power supply.

Chassis Connection

Each circuit breaker will connect to the chassis via compression connections as indicated in diagrams. The "active" connection is adjustable between phases prior to fitting, the neutral position is fixed. This selection will indicate via a coloured indicator on the circuit breaker when installed. This system will allow different quantities of circuit breakers on different phases depending on loads allowing for a much more balanced load. Each circuit breaker is preferably also provided with an interlock to prevent fitting or removing the device while in the "on" position.

Upon connection to the chassis, the printed circuit board extension will connect into a receiver on the chassis and establish an address for the breaker. All of these connections are performed without the need for tools.

Accessory Equipment

Contactors, dimmers, timers etc will be available to connect to the CAN bus. These devices will connect to the circuit breakers and be controlled by the master communication controller. This will enable remote control of circuits, day/night switching and lighting control via dimming at software set parameters.

Time switches can either be software set from a remote PC to be then controlled by the master communication controller on the chassis or an alternate unit that is able to be set from the facia for local operation.

An external interface (to be connected to external dry contacts) will allow signalling from an external point such as a switch, PE cell, proximity sensor to actuate a predetermined action of switching contactors or timers etc.

Terminations

Each circuit breaker will carry up to 25 mm$^2$ cable for active and neutral. The circuit breaker cannot be connected live. The trip mechanism is operated, for example, by depressing/releasing/sliding a button or like mechanism to release access to the screw terminals. The circuit breaker cannot be switched back on until the trip mechanism is released/unlatched and the terminal access covered. This same access strip also acts as a lock for the terminal cover. The terminal cover slides into position with a dovetail and the access strip extends into the cover preventing it from sliding upwards.

LED Local Trip Indication

Each circuit breaker is fitted with an integral LED for status indication.

Green indicates a healthy state of the microcontroller and the circuit breaker on.

Red indicates a tripped circuit breaker. The circuit breaker is in the off position.

Red flashing indicates a failed microcontroller. The tripped circuit breaker. This circuit breaker is internally prevented from being switched back on.

Yellow indicates an RCD trip on the circuit breaker and the circuit breaker is off.

No LED indicates a healthy breaker that is simply turned off.

The toggle will indicate "ON" when in the on position and "OFF" when tripped or off.

Padlocking

Each circuit breaker has an inbuilt padlock facility to take a padlock. In order to fit the padlock, the trip mechanism must be depressed. This will ensure the breaker is off and that it cannot be switched back on. A trip free mechanism will remove the ability to force the toggle "on" when the trip lock is depressed preventing contacts closing as well as preventing latching of the toggle.

The system will be self test and in the event of a master control system failure, indication will be provided. In the event of an individual circuit breaker control failure, it will switch to the off position in a fail to safe scenario.

Features and Advantages of the Circuit Breaker

The present invention therefore provides a power distribution system and method in which the power or other parameters of the system may be monitored, controlled and/or otherwise adjusted. This may be done locally or remotely, as desired. Parameters may be user selected and adjusted, as desired to conform to any desired operating conditions. The system may incorporate a circuit breaker to trip a load circuit, and, be reset, as desired.

The entire control circuitry may be integrated into a single conventional circuit breaker housing, which may be formed to be of standardised physical size, with varying programmable operational characteristics.

The circuit breaker of the present invention has a number of attributes as will now be described.

The present invention provides a single device for circuit protection that is adjustable through a wide variety of parameters, for example, but not limited to currents ranging from say 6 A to 80 A, either with or without the selection and function of RCD. The RCD may be set to, but not restricted to, say 10 mA, 30 mA, 100 mA. Persons skilled in the art will appreciate that these specific values may vary.

Having an adjustable device allows production of a single item and reduces stocking requirements. This enables a larger quantity of items to be supplied prior to nomination of actual/final ratings. Having this flexibility is a significant benefit to the end user as it allows upgrade without equipment replacement. This can be achieved by a service technician or programmer making the required adjustments without shutdown of the rest of the assembly.

Similarly, the in-built capacity to enable the RCD component allows manufacturing of a single item. The programming is software set to the required value. As local adjustment of an RCD is something not permitted under the standards, the device of the present invention allows restricted access to this feature so it cannot be defeated by the user.

Existing equipment requires a change to the product and generally isolation of the assembly to allow this to be done safely. This device uses the programming to access the settings on the microcontroller, then, locks in the required values for permanent operation.

Another significant advance of the device of the present invention is the ability to monitor voltage, current, power, demand (and a number of other parameters) for each individual circuit breaker or group of breakers without the use of additional equipment.

Many high level installations are requiring information about power consumption at a final distribution level. Previously, this requires additional equipment and time consuming installation.

The present invention provides communication of the above-mentioned parameters along with the status of the circuit breaker and/or tripping occurrence for each individual circuit breaker or group of breakers without the use of additional equipment.

Remote communication provides this information for evaluation of system load, peak consumption on certain equipment at particular times, and/or whether individual circuits exceed predetermined values. These values can be set below the protection or tripping values and may be used as a means of power allowance per circuit. They can be referred to as pre-trip alarms. eg. A 72 pole switchboard (24 poles for each phase) fitted with 20 A circuits has the capacity to draw 480 A per phase if each phase is fully loaded. These circuits may typically only be loaded at 10 A. The present invention provides the ability to identify when this value is reached, before overload or tripping will occur. This then provides critical information before failures will happen instead of once they have happened so they may be averted.

The circuit breaker of the present invention also has a built in lock off mechanism that also acts on the contacts to provide a safe access to terminals. This arrangement is provided without the need for any additional components or equipment.

The built in lock off mechanism reduces the need for additional equipment to achieve this level of safety. Larger circuit breakers (mostly with rotary handles) are provided with this facility because the abundance of space makes it easy. The use of this in built arrangement in miniature circuit breakers for final distribution is much more difficult.

The mechanism of the present invention is operated differently to traditional lock off devices that only physically prevent the toggle from being moved. This device allows the toggle to be in a trip free position which means it prevents the internal mechanisms from operating without locking the toggle. These traditional mechanisms can be broken and the toggle then operated. The advantage in leaving the toggle free to be moved (it will not move the contacts) is that there is nothing to force on. The toggle will simply spring back to the off position without moving any internal parts.

The present invention also provides display settings without the need to maintain power. A display screen (e.g. LCD or LED) that will hold the display without power may typically be used.

The prior art current breaker devices typically either provide an electronic display that requires constant power to show values, or, manually operated dials that, when read in conjunction with each other, provide the settings, or a combination of the two.

The arrangement of the present invention is a bi-stable display providing visual ratings and settings on single or three phase circuits with or without power present. As it is a graphic display, it can be selected to display a wide variety of information.

The use of multiple hall-effect current sensors in the device of the present invention, and, for the purposes of actual circuit breaker control is new.

Hall-effect sensors have been used to identify limited ranges in circuit breakers but are not suitable for the full range required for overcurrent, tripping and actual monitoring of the current used.

Figure 6A:
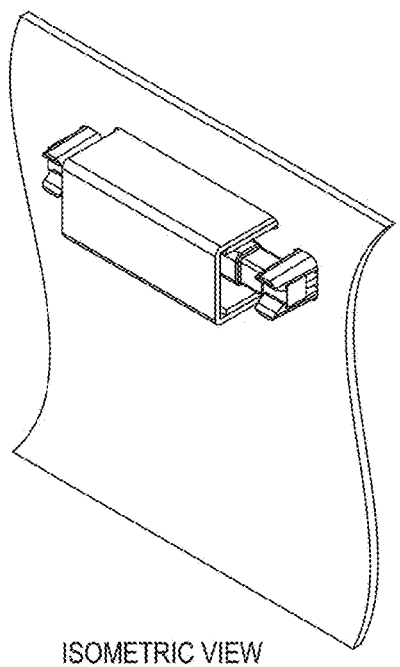
FIG. 6 shows, in FIGS. 6(*a*) and 6(*b*), the layout of the Hall-Effect sensors in the circuit breaker of the present invention.
Figure 6B:
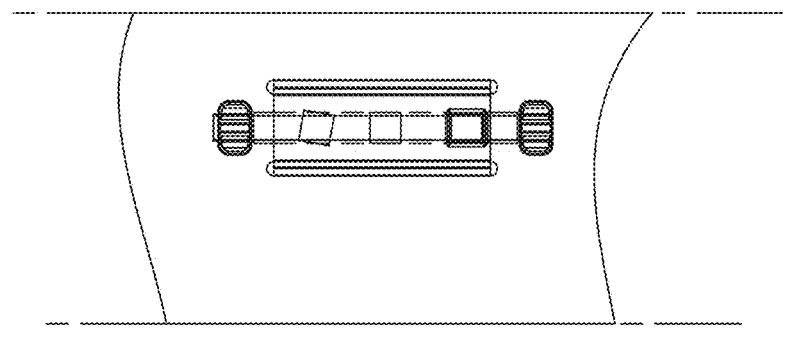

FIG. 6 shows a typical layout of the hall-effect current sensors used in the device of the present invention, including the surrounding components and positions used to achieve the wide range of sensing. The operation of this is as follows: As the circuit breaker needs to read values of normal operating current (10-100% of the nominated value), overload current (110% to 1000% of the nominal operating current), and short circuit current (above 10 times the nominal current), the problem has been that the sensor reaches as point of saturation and cannot read more as the field increases. The process implemented in this device uses 3 steps to achieve the required range from the sensors. A field concentrator is used to focus the magnetic field on the sensor. This concentrator is in the form of a steel lamination on 3 sides of the conductor. The field is prevented from exiting on the sides where the steel lamination is located and as such, must exit on the $4^{th}$ side which provides the whole field in one direction. This is used for the low current range so we can achieve accuracy. A standard pass over a current sensor is used for mid-range values. This is provided without a field concentrator. An offset current sensor is located as the high range sensor. This is offset from the line of conductor by 80 degrees to de-sensitise the sensor. The 3 sensors are mounted on a PCB with the conductor passing over the top with a strip of mylar or other thin insulating material between them. This ensures insulation and the location of a fixed distance of the conductor from the sensors. A magnetic shield sits around the conductor and all 3 sensors to prevent the adverse impact of adjacent devices emitting magnetic fields such as the circuit breaker next to it. The three hall effect sensors each connect to an amplifier circuit to provide a total of 6 ranges that, in combination, allow a very large range or accurate reading. Software in the microcontroller evaluates these figures and determines the current present in the circuit and the subsequent action.

The ability to monitor the system including each individual circuit breaker (single or three phase) for power consumption, current, demand, status of tripping contained within the circuit breaker represent a new concept. FIG. 5 shows the system connected to remote monitoring services.

Current values are provided to the microcontroller by the set of hall-effect sensors. Voltage is detected by points within the circuit breaker to establish the voltage reference as well as the status of the circuit breaker. The circuit breaker is connected to a backplane PCB than is provided with a CAN bus to transfer information.

The CAN bus is connected to a communication controller that outputs the signals as values in particular registers via RS485 protocol, Ethernet, USB or Bluetooth (with the latter two mostly used for programming)

The outputs are not limited to general status but can also provide why a circuit breaker tripped. eg. Overload, short circuit, device coil failure, device controller failure.

Figure 7:
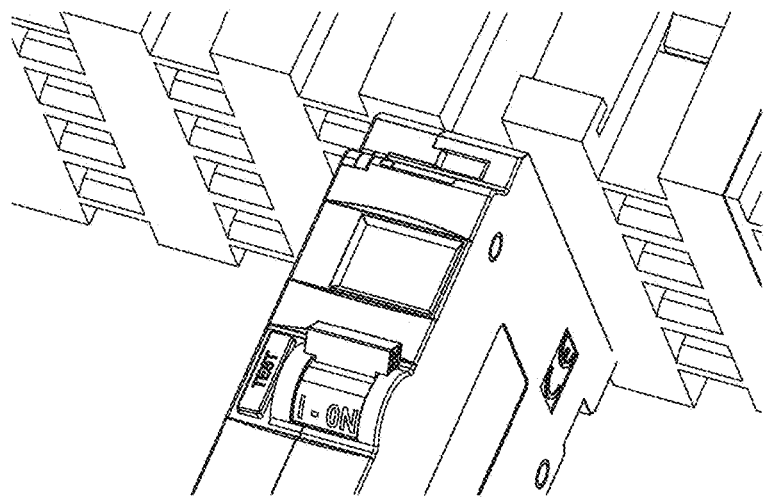
FIG. 7 shows a display on the front of the circuit breaker.

A bi-stable LCD is used to provide constant indication of the values of trip setting and whether the device has the RCD enabled or not. Indication of this nature is required to comply with the relevant standards and must be present whether power is provided or not. FIG. 7 shows an implementation of a bi-stable LCD on the front of the circuit breaker, rating indication is provided whether there is power present or not. The bi-stable LCD uses the power when present to change the display and this display only requires power to make the change to another read out. This display is connected to the internal microcontroller and is adjusted when the ratings of the circuit breaker or RCD function are changed.

Figure 8A:
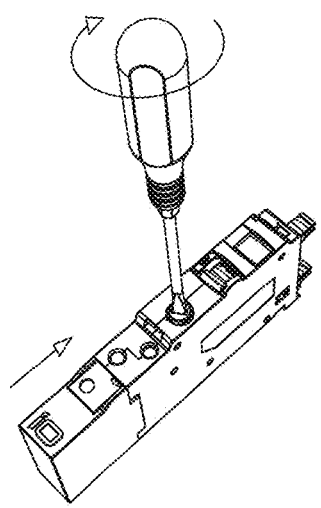
FIG. 8 shows, in FIGS. 8(*a*) and 8(*b*), how the locking mechanism may be unlocked.
Figure 8B:
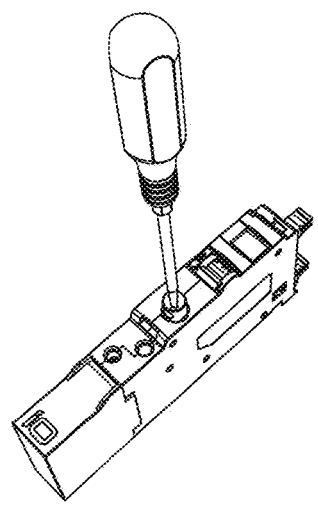

The circuit breaker of the present invention is also provided with a lock of facility. This component operates a sequence of processes that ensure safe operation and connection to the circuit breaker. FIG. 8 shows the lock mechanism with the slide withdrawing.

The turning of the lock out dial first operates the trip mechanism on the circuit breaker, disconnecting the active conductor. The second stage of the sequence is to disconnect the neutral from the load terminals. The third and fourth stages within the sequence are simultaneous and they withdraw a slide that provides access to the screw terminals and allows the terminal cover to be removed to access cables. Once this sequence has been completed (with the ¼ turn of the lockout) the dial has raised up above the circuit breaker to expose a locking hole for a padlock. The locking of this mechanism prevents the circuit breaker form being turned on and the neutral from being connected. Only upon removal of the lock and returning the operator to the normal state, can the circuit breaker then be turned on.

Figure 9:
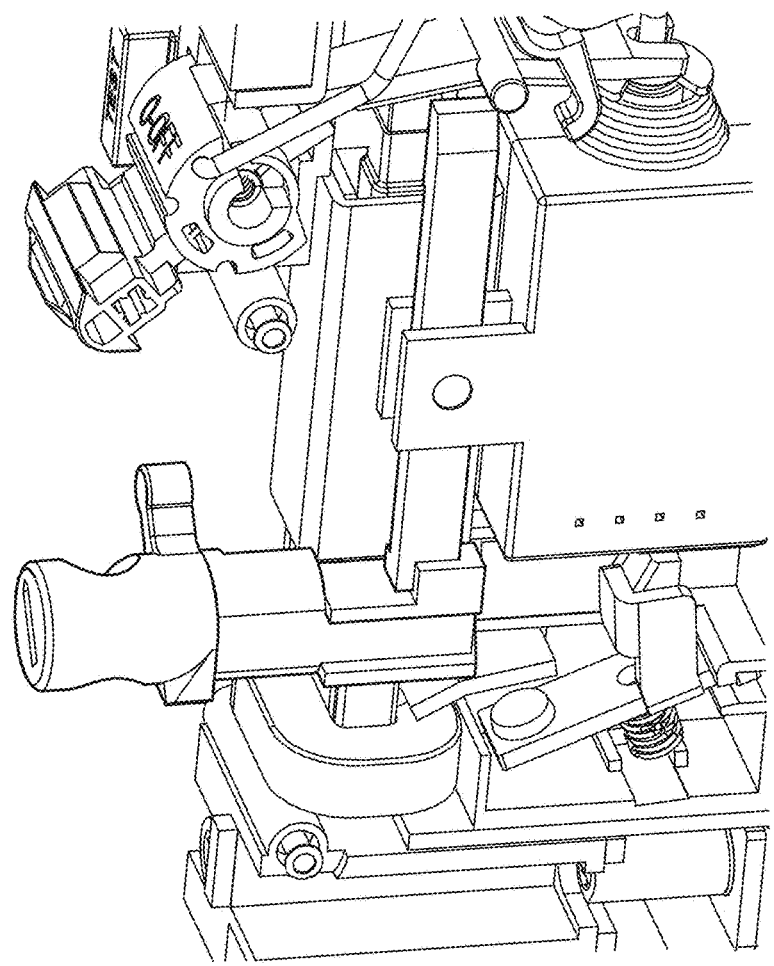
FIG. 9 shows how isolation of the neutral is operated by the locking mechanism, that is, upon rotation, the dial raises up, tripping the circuit breaker, then, opening the neutral.
Figure 10:
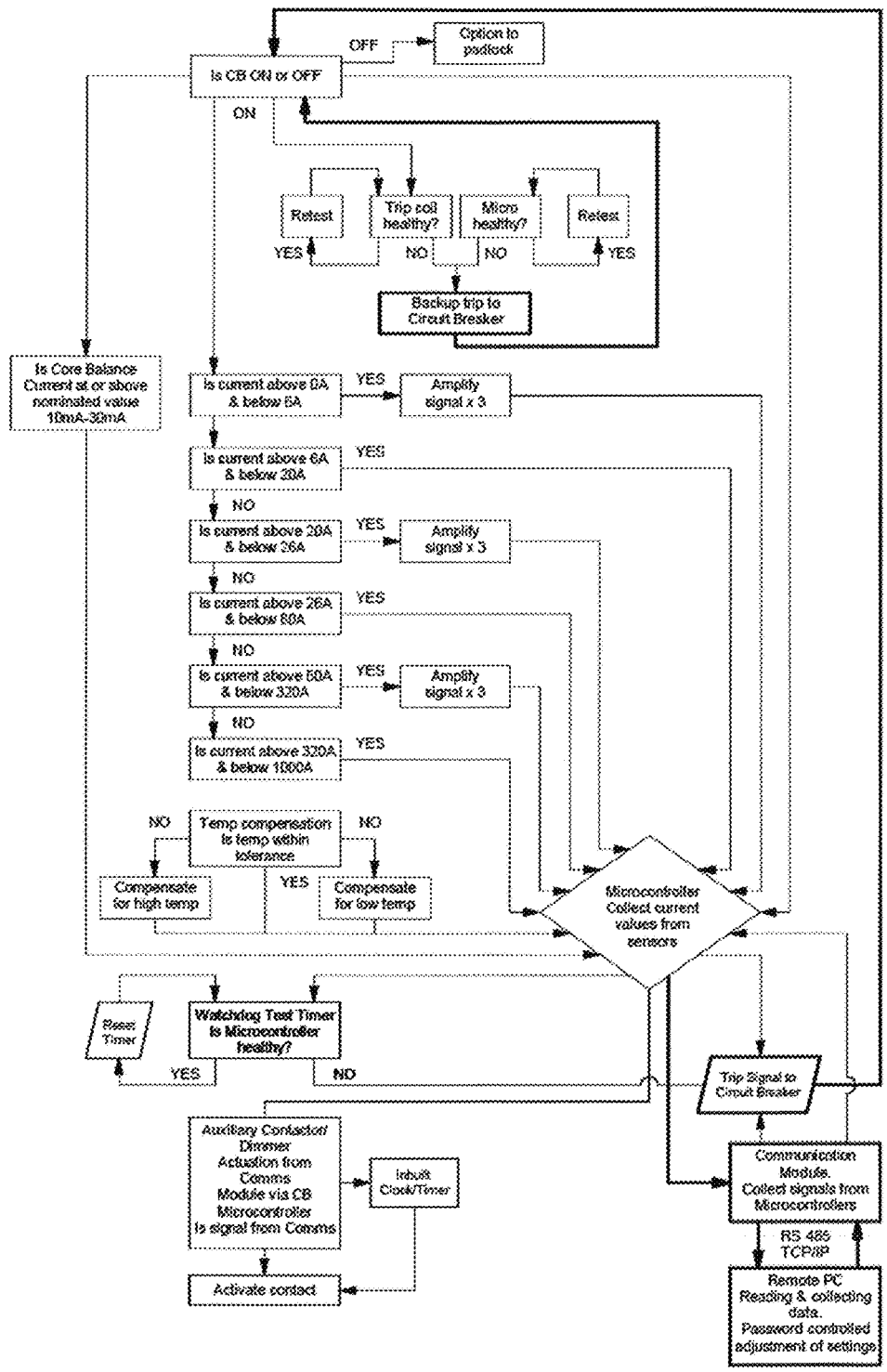
FIG. 10 illustrates a flowchart showing a preferred but alternative simplified operation of the power distribution of the present invention.

Internal isolation of the neutral conductor when access is provided to the load terminals. The neutral conductor runs inside the circuit breaker without occupying additional pole spaces. When existing equipment has a neutral conductor built in, it occupies additional space equivalent to one of the phases. Due to the operation of the device, the sequence ensures the neutral is present when the circuit breaker is on but allows isolation after the circuit breaker is off. The basic operation of the neutral is last off, first on. FIG. 9 shows the neutral arrangement in the circuit breaker. The neutral runs in the lower part of the circuit breaker avoiding the need for additional pole space. FIG. 9 also shows the isolation of the neutral and the mechanism disconnecting the active before isolation of the neutral.

The lock off feature uses a dial as the main operator and a system of slides, levers, and pushrod to provide the relevant actuation of the trip mechanism, neutral disconnection and terminal access. The dial operates a pushrod that immediately lifts against a trip bar connected to the release of the sprung contacts of the active conductor. As the pushrod moves upwards, being pulled by the rotation of the lock out dial, it begins to open the neutral contact. Further operation, withdraws a slide that allows holes in this slide to line up with terminal access for the screw terminals. In this process of the slide withdrawing, it has cleared from the terminal cover shielding the terminals so it may then be removed. This integrated feature provides safe access that is interlocked so no access to the live terminals can be achieved.

It will become apparent to persons skilled in the art that numerous variations and modifications may be made to the system. All such variations and modifications should be considered to fall within the scope of the invention as broadly hereinbefore described.

The claims defining the present invention are as follows:

1. A circuit breaker of the type adapted to be installed in an electrical distribution board, including:
    a casing, having a pair of terminals adapted to be connected in series with a load and having a resettable toggle switch;
    a sensor, including multiple Hall-Effect sensors to sense a current in said load, each of said Hall-Effect sensors having a different sensitivity;
    a ferromagnetic shield surrounding the multiple Hall-Effect sensors; and
    a microcontroller, connected to a programmable input unit, for user input and/or adjustment of predetermined maximum load current of said load, said microcontroller adapted to compare said sensed load current sensed by said sensor with said predetermined maximum load current, and operate said circuit breaker when said sensed load current exceeds said predetermined load current;
    wherein the multiple Hall-Effect sensors are magnetically coupled to an active conductor connected to one of the pair of terminals, and wherein the multiple Hall-Effect sensors include:
        a first Hall-Effect sensor provided with a field concentrator in the form of a ferromagnetic material around the active conductor to direct a magnetic field to the first Hall-Effect sensor;
        a second Hall-Effect sensor provided without a field concentrator; and
        a third Hall-Effect sensor provided without a field concentrator and arranged at a deflected angle relative to the active conductor.

2. The circuit breaker as claimed in claim 1, which is programmable to operate at a range of current ratings, preferably, but not limited to between 4 A to 100 A.

3. The circuit breaker as claimed in claim 1, wherein said input unit is adapted to be programmed remotely.

4. The circuit breaker as claimed in claim 1, which is adapted to be monitored remotely.

5. The circuit breaker as claimed in claim 1, which is adapted to be operated/tripped remotely.

6. The circuit breaker as claimed in claim 1, which has a built in Residual Current Device (RCD) that can be adjusted to turn on or off, or to operate at a range of currents, including 10 mA, 30 mA, 100 mA.

7. The circuit breaker as claimed in claim 1, which has a lock mechanism, comprising at least one padlock.

8. The circuit breaker as claimed in claim 1, further including:
a display unit, to display predetermined load parameters, actual values and/or other indicia.

9. A power distribution system, including:
a power supply;
a communications controller, for user input and/or adjustment of predetermined load parameters;
at least one load;
a circuit breaker associated with each said load, to selectively connect said power supply to each load, each circuit breaker being of the type adapted to be installed in an electrical distribution board including:
a casing, having a pair of terminals adapted to be connected in series with a load and having a resettable toggle switch;
a sensor, including multiple Hall-Effect sensors to sense a current in said load, each of said Hall-Effect sensors having a different sensitivity;
a ferromagnetic shield surrounding the multiple Hall-Effect sensors; and
a microcontroller, connected to the communications controller, for user input and/or adjustment of predetermined maximum load current of said load, said microcontroller adapted to compare said sensed load current sensed by said sensor with said predetermined maximum load current, and operate said circuit breaker when said sensed load current exceeds said predetermined load current;
wherein the multiple Hall-Effect sensors are magnetically coupled to an active conductor connected to one of the pair of terminals, and wherein the multiple Hall-Effect sensors include:
a first Hall-Effect sensor provided with a field concentrator in the form of a ferromagnetic material around the active conductor to direct a magnetic field to the first Hall-Effect sensor;
a second Hall-Effect sensor provided without a field concentrator; and
a third Hall-Effect sensor provided without a field concentrator and arranged at a deflected angle relative to the active conductor.

10. The power distribution system as claimed in claim 9, wherein at least one of said circuit breakers is programmable to operate at a range of current values, including between 4 A and 100 A.

11. The power distribution system as claimed in claim 10, wherein said communications controller is located remotely from said circuit breaker(s).

12. The power distribution system as claimed in claim 9 further including:
a communications channel, such as, but not limited to a wireless communications channel, for remote programming, monitoring and/or tripping of said circuit breaker(s) via said communications controller.

13. The power distribution system as claimed in claim 9, wherein said circuit breaker(s) include a residual current device (RCD).

14. The power distribution system as claimed in claim 9, wherein said current breaker(s) includes a locking mechanism.

15. The power distribution system as claimed in claim 9, wherein said current breaker(s) includes a display unit to display said predetermined load parameters.

* * * * *